United States Patent
Amano et al.

(10) Patent No.: US 11,495,482 B2
(45) Date of Patent: Nov. 8, 2022

(54) AUTOMATIC SUPERVISING METHOD AND CONTROL DEVICE

(71) Applicant: TOKYO ELECTRON LIMITED, Tokyo (JP)

(72) Inventors: Yoichi Amano, Nirasaki (JP); Kota Tanabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 710 days.

(21) Appl. No.: 16/441,815

(22) Filed: Jun. 14, 2019

(65) Prior Publication Data

US 2019/0393061 A1 Dec. 26, 2019

(30) Foreign Application Priority Data

Jun. 20, 2018 (JP) .............................. JP2018-117253

(51) Int. Cl.
| | |
|---|---|
| *H01L 21/67* | (2006.01) |
| *B65G 43/08* | (2006.01) |
| *G01V 8/12* | (2006.01) |
| *G01V 8/20* | (2006.01) |

(Continued)

(52) U.S. Cl.
CPC ........ *H01L 21/67259* (2013.01); *B65G 43/08* (2013.01); *G01V 8/12* (2013.01); *G01V 8/20* (2013.01); *H01L 21/67196* (2013.01); *H01L 21/67201* (2013.01); *H01L 21/67742* (2013.01); *H01L 21/68742* (2013.01); *B65G 2201/0297* (2013.01)

(58) Field of Classification Search
CPC ...... G01V 8/12; G01V 8/20; H01L 21/67259; H01L 21/67196; H01L 21/67201; H01L 21/67742; H01L 21/68742; B65G 43/08; B65G 2201/0297
See application file for complete search history.

(56) References Cited

U.S. PATENT DOCUMENTS

| | | | |
|---|---|---|---|
| 2004/0164256 A1* | 8/2004 | Fan ........................... | G01V 8/12 250/559.29 |
| 2014/0060229 A1* | 3/2014 | Chen ................. | H01L 21/67742 901/9 |
| 2017/0011940 A1* | 1/2017 | Shindo .............. | H01L 21/67167 |

(Continued)

FOREIGN PATENT DOCUMENTS

| | | |
|---|---|---|
| JP | 11-163080 A | 6/1999 |
| JP | 2002124556 A | 4/2002 |

(Continued)

*Primary Examiner* — James R Bidwell
(74) *Attorney, Agent, or Firm* — Nath, Goldberg & Meyer; Jerald L. Meyer; Tanya E. Harkins

(57) ABSTRACT

There is provided a method of automatically supervising a transfer operation of a transfer device including an optical sensor, the optical sensor having a light emitting part and a light receiving part provided in a head of a holding part for holding a substrate, the method including: acquiring a change in intensity of a first reflected light reflected off a first object by radiating a light from the light emitting part toward the first object below the holding part and receiving the first reflected light reflected off the first object by the light receiving part, while horizontally moving the holding part; and specifying an end position of the first object based on the change in intensity of the first reflected light.

10 Claims, 20 Drawing Sheets

(51) Int. Cl.
*H01L 21/677* (2006.01)
*H01L 21/687* (2006.01)

(56) References Cited

U.S. PATENT DOCUMENTS

2018/0240695 A1* 8/2018 Hayashi ................ B65G 43/08
2020/0118851 A1* 4/2020 Goto ..................... B65G 49/07
2020/0161161 A1* 5/2020 Wu ................... H01L 21/67259

FOREIGN PATENT DOCUMENTS

| JP | 2010226014 A | 10/2010 |
| JP | 2015-149365 A | 8/2015 |
| JP | 2018-003085 A | 1/2018 |

* cited by examiner

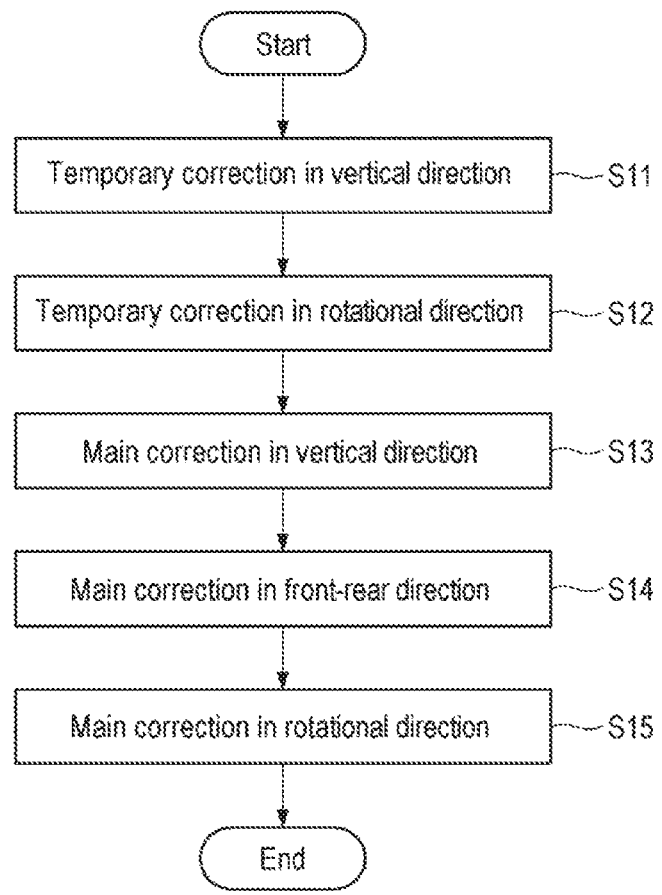

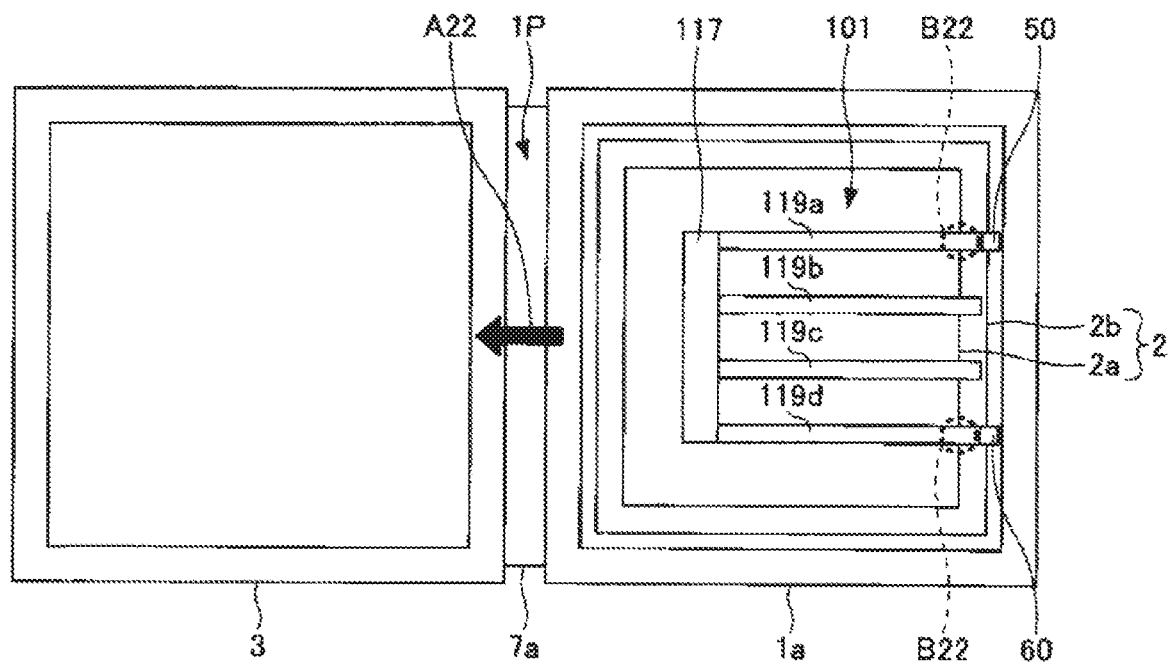
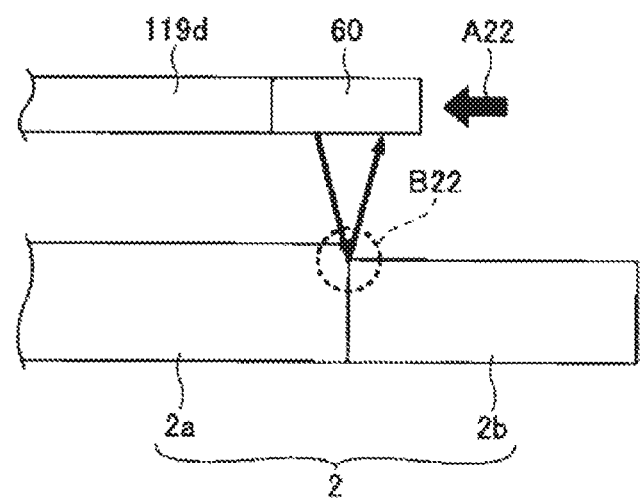

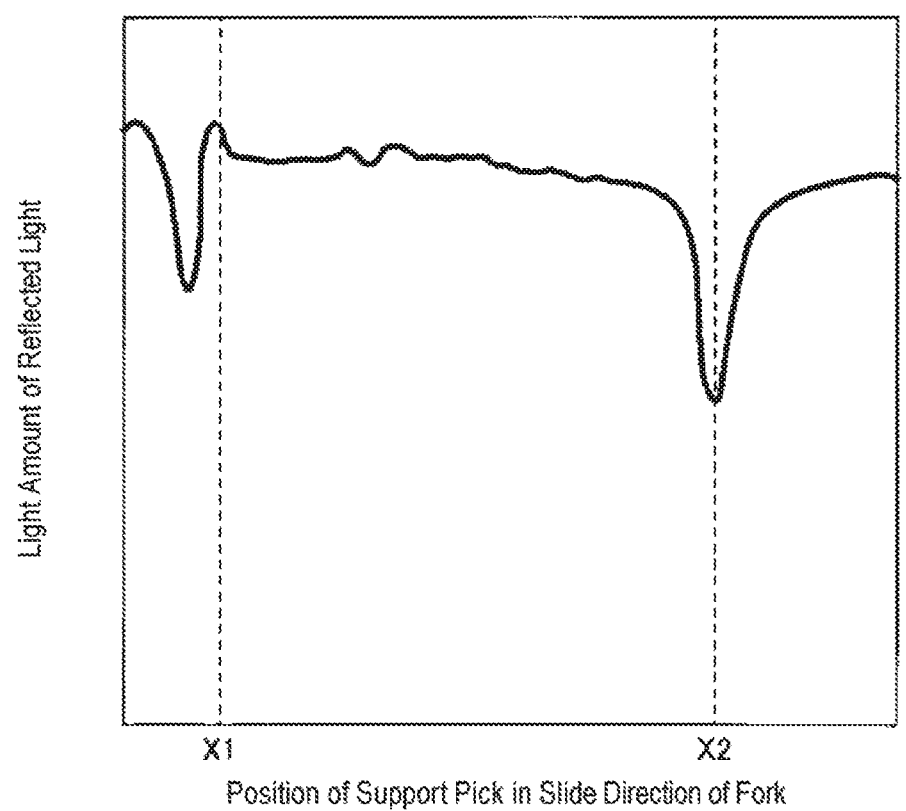

AUTOMATIC SUPERVISING METHOD AND CONTROL DEVICE

CROSS-REFERENCE TO RELATED APPLICATION

This application is based upon and claims the benefit of priority from Japanese Patent Application No. 2018-117253, filed on Jun. 20, 2018, the entire contents of which are incorporated herein by reference.

TECHNICAL FIELD

The present disclosure relates to an automatic supervising method and a control device.

BACKGROUND

There is known a substrate processing system that includes a transfer chamber in which a transfer device for transferring a substrate is provided, and a plurality of process chambers disposed around the transfer chamber. The substrate is transferred between the transfer chamber and each process chamber by the transfer device. In the substrate processing system, a technique of automatically detecting a horizontal position of the transfer device is known (for example, see Patent Document 1).

RELATED ART DOCUMENTS

Patent Documents

Patent Document 1: Japanese laid-open publication No. 2015-149365

SUMMARY

The present disclosure provides a technique capable of automatically adjusting a position of a transfer operation.

According to one embodiment of the present disclosure, there is provided a method of automatically supervising a transfer operation of a transfer device including an optical sensor, the optical sensor having a light emitting part and a light receiving part provided in a head of a holding part for holding a substrate, the method including acquiring a change in intensity of a first reflected light reflected off a first object by radiating a light from the light emitting part toward the first object below the holding part and receiving the first reflected light reflected off the first object by the light receiving part, while horizontally moving the holding part; and specifying an end position of the first object based on the change in intensity of the first reflected light.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a flowchart illustrating an automatic supervising method according to a first embodiment.

FIGS. 17A and 17B are views for explaining step S22 in the automatic supervising method according to the second embodiment.

FIG. 24 is a diagram showing a relationship between a position of the supporting pick in a slide direction of a fork and an amount of reflected light.

DETAILED DESCRIPTION

Figure 1:
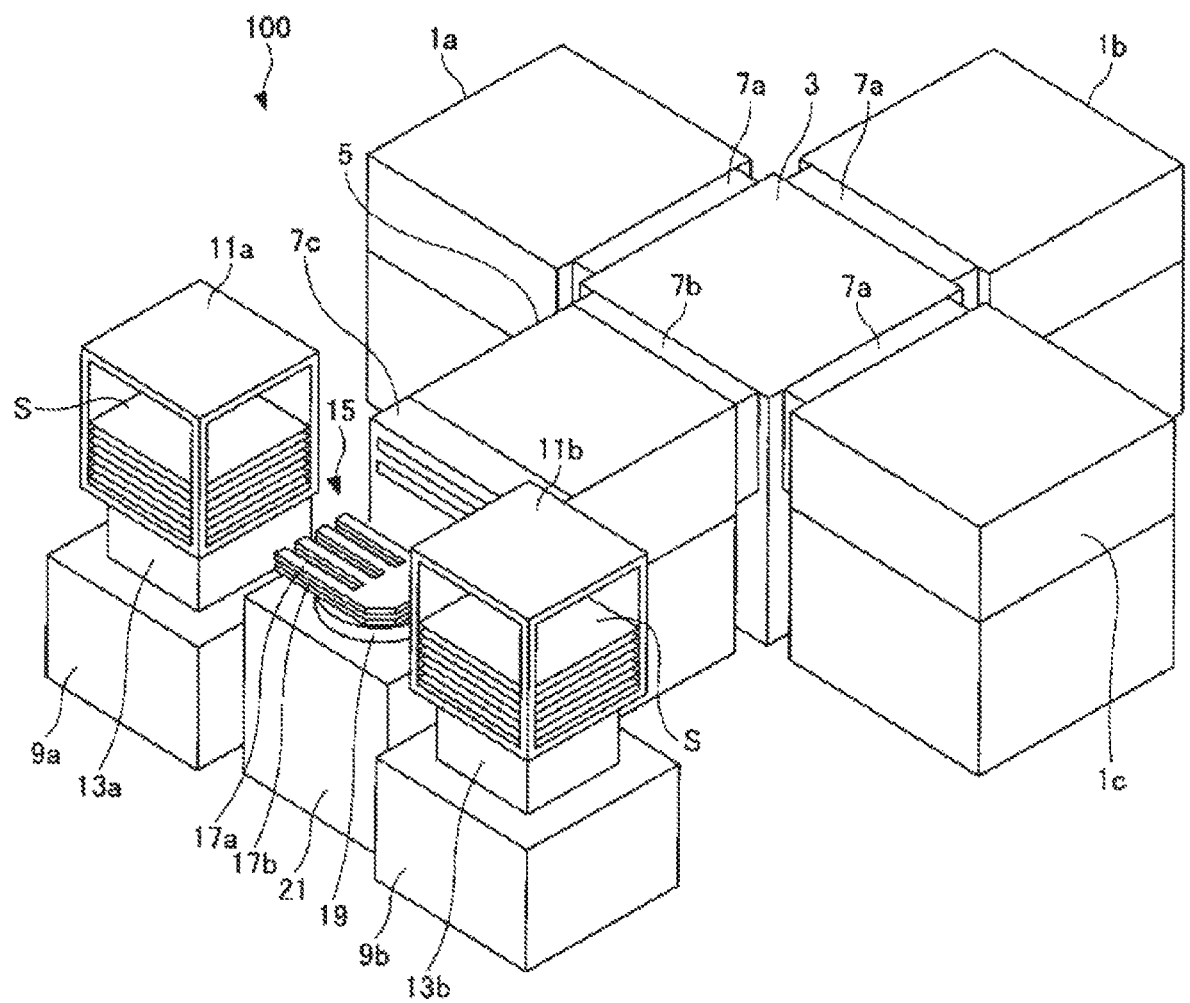
FIG. 1 is a perspective view illustrating an exemplary configuration of a substrate processing system.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

Figure 2:
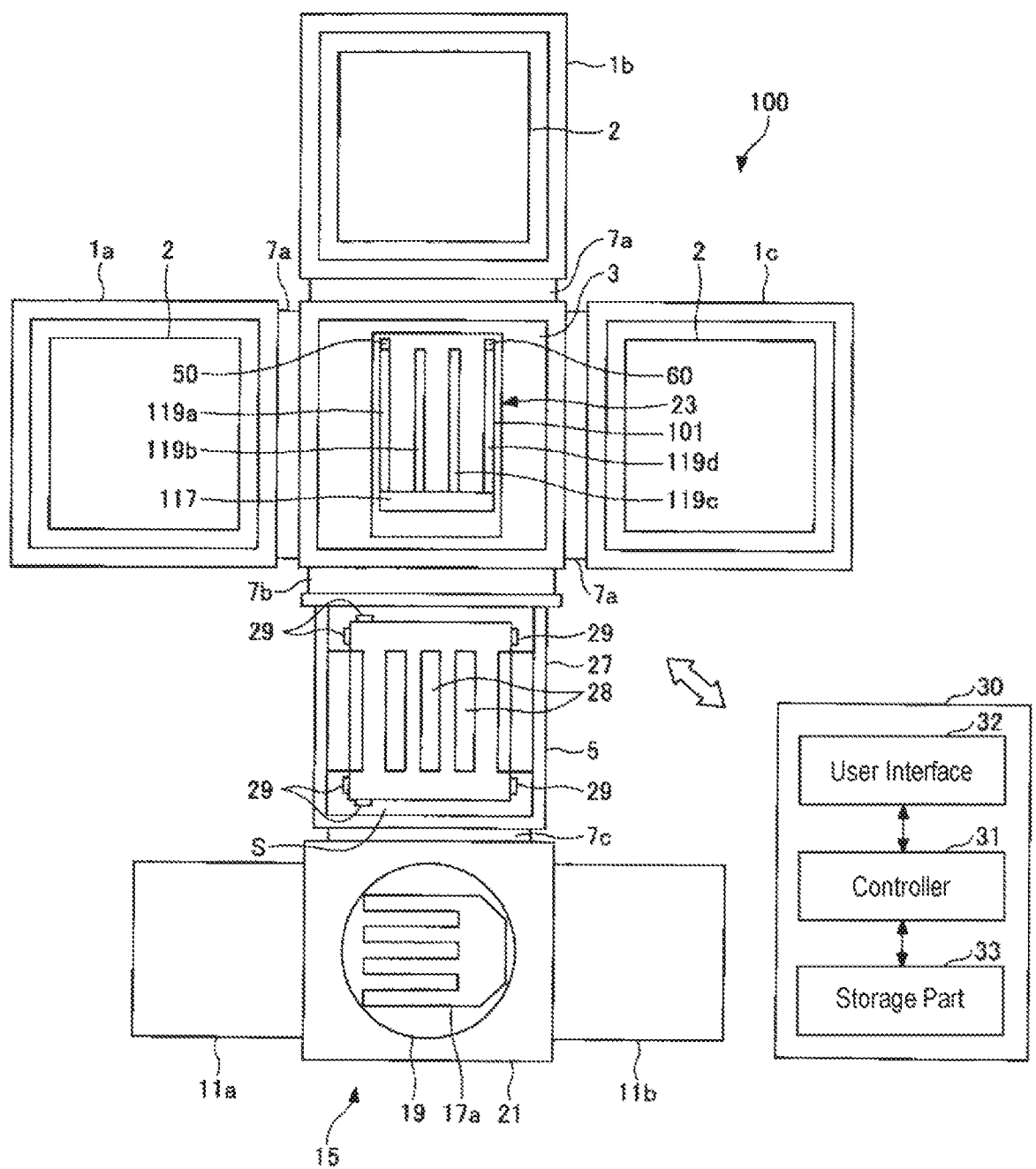
FIG. 2 is a plan view of the substrate processing system of FIG. 1.

An example of a substrate processing system capable of implementing an automatic supervising method according to an embodiment of the present disclosure will be described. FIG. 1 is a perspective view illustrating an exemplary configuration of the substrate processing system. FIG. 2 is a plan view of the substrate processing system shown in FIG. 1.

As illustrated in FIG. 1, a substrate processing system 100 is a multi-chamber system including three process chambers 1a, 1b, and 1c. The substrate processing system 100 is a vacuum processing system configured to perform a plasma process on a glass substrate (hereinafter, referred to as a "substrate S") for a flat panel display (FPD) such as a liquid crystal display, an organic EL display or the like.

In the substrate processing system 100, a plurality of bulky chambers is connected to each other in a cruciform pattern in a plan view. In the cruciform pattern, a transfer chamber 3 is provided in the central portion and three process chambers 1a, 1b and 1c are provided adjacent to three lateral sides of the transfer chamber 3. Each of the process chambers 1a, 1b and 1c performs a plasma process on a substrate S provided therein. A load-lock chamber 5 is provided adjacent to the remaining lateral side of the transfer chamber 3. All the process chambers 1a, 1b, and 1c, the transfer chamber 3, and the load-lock chamber 5 are constituted as vacuum chambers.

An opening (not illustrated) is provided between the transfer chamber 3 and each of the process chambers 1a, 1b, and 1c. A gate valve 7a having an opening/closing function is provided in the opening. An opening (not illustrated) is provided between the transfer chamber 3 and the load-lock chamber 5. A gate valve 7b having an opening/closing function is provided in the opening. The gate valves 7a and 7b, when being brought into a closed state, hermetically seal between the respective chambers, and when being brought into an opened state, allow the respective chambers to be in communication with each other such that the substrate S is transferred therebetween. A gate valve 7c is provided between the load-lock chamber 5 and an external atmosphere. When the gate valve 7c is brought into a closed state, the airtightness of the load-lock chamber 5 is kept, and when the gate valve 7c is brought into an opened state, substrate S is transferred between inside and outside of the load-lock chamber 5.

Two indexers 9a and 9b are provided outside the load-lock chamber 5. Cassettes 11a and 11b, each of which accommodates substrates S, are placed on the indexers 9a and 9b, respectively. In each of the cassettes 11a and 11b, the substrates S are arranged in multiple stages at intervals in the vertical direction. For example, unprocessed substrates may be accommodated in one cassette 11a and processed substrates subjected to a predetermined process may be accommodated in the other cassette 11b. Lifting mechanisms 13a and 13b are provided below the cassettes 11a and 11b, respectively. The cassettes 11a and 11b are raised or lowered with the operation of the lifting mechanisms 13a and 13b, respectively.

A transfer device 15 configured to transfer the substrate S is provided between the cassette 11a and the cassette 11b. The transfer device 15 includes forks 17a and 17b arranged in two stages one above another in the vertical direction, a driver 19 that supports the forks 17a and 17b in a swingable and extendible manner, and a supporting table 21 that supports the driver 19.

The process chambers 1a, 1b, and 1c are configured such that the internal spaces thereof can be maintained at a predetermined depressurized atmosphere (vacuum state). As illustrated in FIG. 2, each of the process chambers 1a, 1b, and 1c is provided with a susceptor 2 as a stage on which the substrate S is placed. The susceptor 2 includes an electrode part 2a and a ceramic part 2b, which will be described later. The electrode part 2a is formed in, for example, a rectangular shape in a plan view. An outer shape of the electrode part 2a is smaller than, for example, an outer shape of the substrate S. The substrate S is mounted on an upper surface of the electrode pail 2a. The ceramic part 2b is provided around the electrode part 2a. In each of the process chambers 1a, 1b, and 1c, in the state in which the substrate S is placed on the susceptor 2, a plasma process such as an etching process, an asking process, a film-forming process or the like is performed on the substrate S under a vacuum condition. In some embodiments, the same process may be performed in the process chambers 1a, 1b, and 1c, or different types of processes may be performed in the process chambers.

Similar to the process chambers 1a, 1b, and 1c used as vacuum process chambers, the transfer chamber 3 is configured to be maintained in a predetermined depressurized atmosphere. As illustrated in FIG. 2, a transfer device 23 is provided inside the transfer chamber 3. The transfer device 23 transfers the substrate S between the process chambers 1a, 1b, and 1c and the load-lock chamber 5. The transfer device 23 includes upper and lower transfer mechanisms provided in two stages one above another in the vertical direction, and is configured to load and unload the substrates S independently of one another using the upper and lower transfer mechanisms.

Figure 3:
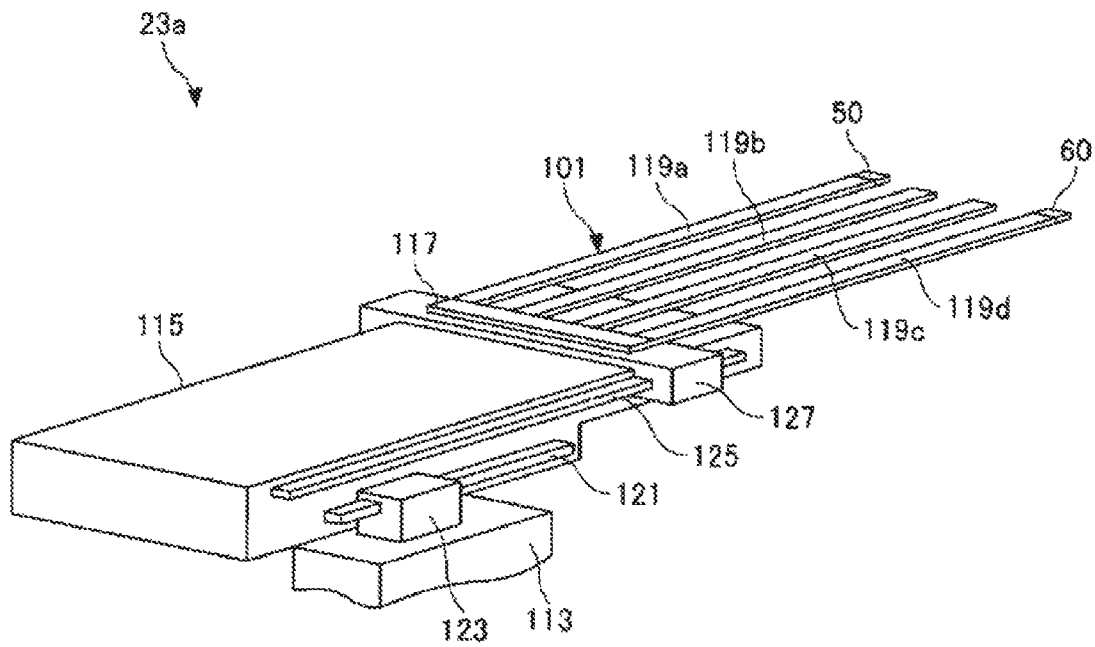
FIG. 3 is a perspective view illustrating an exemplary configuration of a transfer mechanism.

FIG. 3 is a perspective view illustrating an exemplary configuration of a transfer mechanism. As illustrated in FIG. 3, a transfer mechanism 23a (the upper transfer mechanism includes a pedestal portion 113, a slide arm 115 provided to be slidable with respect to the pedestal portion 113, a fork 101 provided on the pedestal portion 113 and used as a supporting member that supports the substrate S. The fork 101 is configured to be movable into/out of each of the process chambers 1a, 1b, and 1c, and the load-lock chamber 5. The fork 101 includes a pick base 117, and a plurality of supporting picks 119 used as holders connected to the pick base 117. In the example of FIG. 3, the supporting picks 119 of the fork 101 includes four supporting picks 119a, 119b, 119c, and 119d (collectively referred to sometimes as a supporting pick 119). Sensor parts 50 and 60 are provided in heads of the supporting picks 119a and 119d, respectively.

Figure 4:
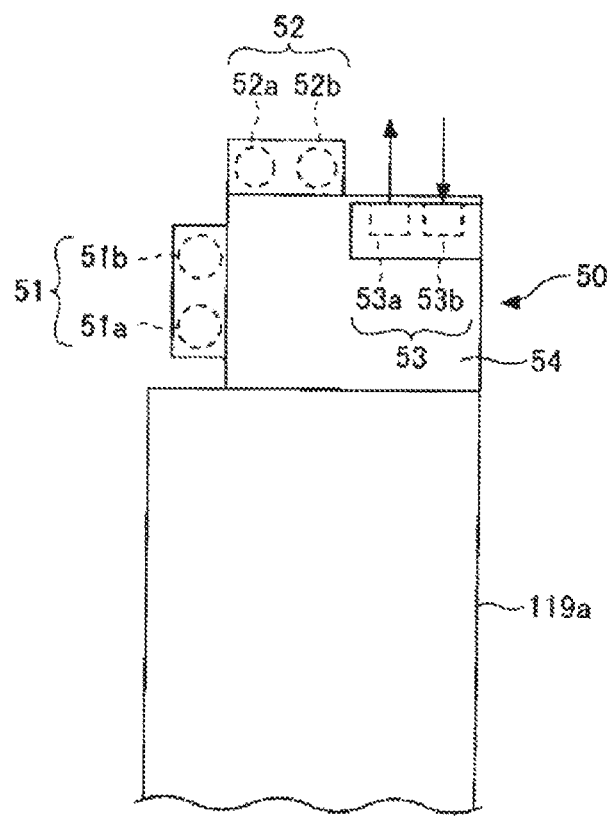
FIG. 4 is a plan view illustrating an example of arrangement of a sensor part provided in a left supporting pick.

FIG. 4 is a plan view illustrating an arrangement example of the sensor part 50 that is provided on the supporting pick 119a disposed at the left side. As illustrated in FIG. 4, the sensor part 50 includes an optical sensor 51, an optical sensor 52, an optical sensor 53, and a supporting member 54. In some embodiments, the sensor part 50 may include at least one of the optical sensor 51 and the optical sensor 52.

The optical sensor 51 is installed on the supporting member 54 and detects an object existing below the supporting pick 119a. The optical sensor 51 may be a laser sensor having a light emitting part 51a and a light receiving part 51b. The light emitting part 51a and the light receiving part 51b are disposed along a longitudinal direction of the supporting pick 119a. The optical sensor 51 radiates a laser light from the light emitting part 51a toward the object below the supporting pick 119a, receives a light reflected off the object by the light receiving part 51b, and outputs a variation in intensity of the reflected light.

The optical sensor 52 is installed on the supporting member 54 and detects an object existing below the supporting pick 119a. The optical sensor 52 may be a laser sensor having a light emitting part 52a and a light receiving part 52b. The light emitting part 52a and the light receiving part 52b are disposed in a widthwise direction of the supporting pick 119a. The optical sensor 52 radiates a laser light from the light emitting part 52a toward the object below the supporting pick 119a, receives a light reflected off the object by the light receiving part 52b, and outputs a variation in intensity of the reflected light.

The optical sensor 53 is installed on the supporting member 54, and detects an object in a direction of the head of the supporting pick 119a. The optical sensor 53 may be a laser sensor having a light emitting part 53a and a light receiving part 53b. The light emitting part 53a and the light receiving part 53b are disposed along the widthwise direction of the supporting pick 119a. The optical sensor 53 radiates a laser light from the light emitting part 53a toward the object in the direction of the head of the supporting pick 119a, receives a light reflected off the object by the light receiving part 53b, and outputs a variation in intensity of the reflected light.

The supporting member 54 has a substantially plate shape and is installed on the head of the supporting pick 119a disposed at the left side. The supporting member 54 supports the optical sensors 51, 52, and 53.

In the sensor part 50 configured as above, the optical sensor 51 may be used to detect a boundary position formed along the widthwise direction of the supporting pick 119a below the supporting pick 119a with high accuracy. In addition, the optical sensor 52 may be used to detect a boundary position formed along the longitudinal direction of the supporting pick 119a below the supporting pick 119a with high accuracy.

Figure 5:
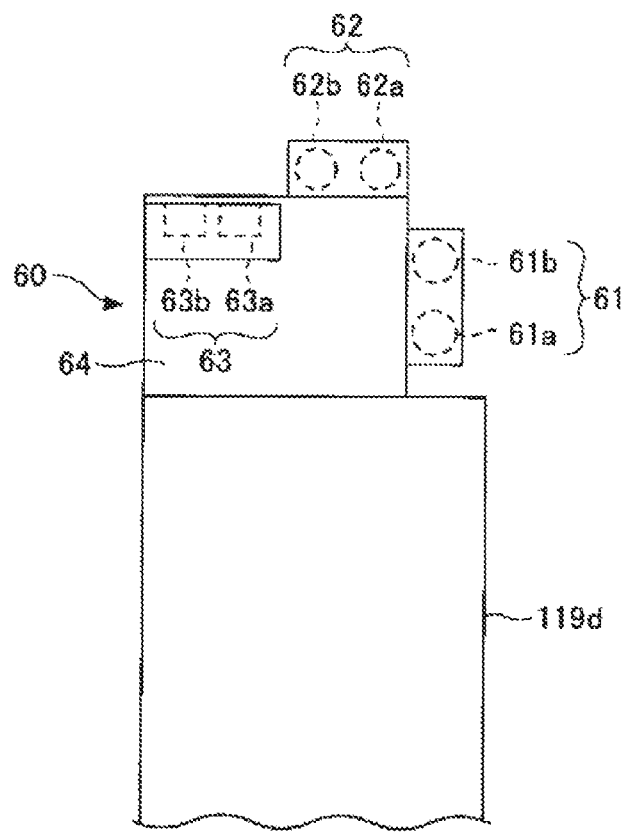
FIG. 5 is a plan view illustrating an example of arrangement of a sensor part provided in a right supporting pick.

FIG. 5 is a plan view illustrating an arrangement example of the sensor part 60 that is provided on the supporting pick 119d disposed at the right side. As illustrated in FIG. 5, the sensor part 60 includes an optical sensor 61, an optical sensor 62, an optical sensor 63, and a supporting member 64. In some embodiments, the sensor part 60 may include at least one of the optical sensor 61 and the optical sensor 62.

The optical sensor 61 is installed on the supporting member 64 and detects an object existing below the supporting pick 119d. The optical sensor 61 may be a laser sensor having a light emitting part 61a and a light receiving part 61b. The light emitting part 61a and the light receiving part 61b are disposed along a longitudinal direction of the supporting pick 119d. The optical sensor 61 radiates a laser light from the light emitting part 61a toward the object below the supporting pick 119d, receives a light reflected off the object by the light receiving part 61b, and outputs a variation in intensity of the reflected light.

The optical sensor 62 is installed on the supporting member 64 and detects an object below the supporting pick 119d. The optical sensor 62 may be a laser sensor having a light emitting part 62a and a light receiving part 62b. The light emitting part 62a and the light receiving part 62b are disposed in a widthwise direction of the supporting pick 119d. The optical sensor 62 radiates a laser light from the light emitting part 62a toward the object below the supporting pick 119d, receives a light reflected off the object by the light receiving part 62b, and outputs a variation in intensity of the reflected light.

The optical sensor 63 is installed on the supporting member 64, and detects an object in a direction of the head of the supporting pick 119d. The optical sensor 63 may be a laser sensor having a light emitting part 63a and a light receiving part 63b. The light emitting part 63a and the light receiving part 63b are disposed in the widthwise direction of the supporting pick 119d. The optical sensor 63 radiates a laser light from the light emitting part 63a toward the object in the direction of the head of the supporting pick 119d, receives a light reflected off the object by the light receiving part 63b, and outputs a variation in intensity of the reflected light.

The supporting member 64 has a substantially plate shape, and is installed on the head of the supporting pick 119d disposed at the right side. The supporting member 64 supports the optical sensors 61, 62, and 63.

In the sensor part 60 configured as above, the optical sensor 61 may be used to detect a boundary position formed along the widthwise direction of the supporting pick 119d below the supporting pick 119d with high accuracy. In addition, the optical sensor 62 may be used to detect a boundary position formed along the longitudinal direction of the supporting pick 119d below the supporting pick 119d with high accuracy.

While in FIGS. 3 to 5, the cases in which the sensor parts 50 and 60 has been described to be respectively provided on the left-side supporting pick 119a and the right-side supporting pick 119d, sensor parts may be respectively provided on other supporting picks 119b and 119c.

Returning to FIG. 3, a guide 121 through which the slide arm 115 slides relative to the pedestal portion 113 is provided on a lateral portion of the slide arm 115. A slide supporting part 123 configured to slidably support the guide 121 is provided on the pedestal portion 113.

In addition, a guide 125 through which the fork 101 slides relative to the slide arm 115 is provided on the lateral portion of the slide arm 115. The guide 125 is disposed in parallel to the guide 121. In addition, a slider 127 is provided to slide along the guide 125. The fork 101 is installed in the slider 127.

Although in FIG. 3, the upper transfer mechanism 23a has been described, the lower transfer mechanism (not illustrated) also has the same configuration as the upper transfer mechanism 23a. The upper and lower transfer mechanisms may be connected to each other by a connection mechanism (not illustrated), and may be configured to rotate as a unit in the horizontal direction. In addition, the upper and lower transfer mechanisms configured in two stages in the vertical direction may be connected to a drive unit (not illustrated) that performs the slide operation of the slide arm 115 and the fork 101, and the rotation operation and lifting operation of the pedestal portion 113.

Like the process chambers 1a, 1b, and 1c and the transfer chamber 3, the load-lock chamber 5 is configured to be maintained in a predetermined depressurized atmosphere. The load-lock chamber 5 is a chamber through which the substrate S is delivered between the cassettes 11a and 11b kept in an air atmosphere and the transfer chamber 3 kept in the depressurized atmosphere. The load-lock chamber 5 is configured to be repeatedly switched between the air atmosphere and the depressurized atmosphere. Thus, the load-lock chamber 5 has a small internal volume. The load-lock chamber 5 includes substrate accommodation parts 27 configured in two stages in the vertical direction (only an upper substrate accommodation part is illustrated in FIG. 2). Each of the substrate accommodation parts 27 is provided with a buffer 28 configured to support the substrates S thereon. The buffer 28 includes a plurality of supporting parts disposed in a mutually spaced-apart relationship. Each gap formed in the buffer 28 serves as a relief groove of a comb-shaped supporting pick (e.g., the supporting pick 119 of the fork 101). In addition, one or two positioners 29, each of which is brought into contact with each side of the substrate S of a rectangular shape to perform positioning, is provided inside the load-lock chamber 5.

The substrate processing system 100 includes a control part 30 that controls the operation of each part. The control part 30 includes a controller 31, a user interface 32, and a storage part 33. The controller 31 includes a CPU, and controls operations of respective parts such as the process chambers 1a, 1b, and 1c, the transfer device 15, and the transfer device 23 in the substrate processing system 100. For example, the user interface 32 may include a keyboard that allows a process manager to perform an input operation of a command to manage the substrate processing system 100, and a display that visualizes and displays the operation status of the substrate processing system 100. The storage part 33 stores a control program (software) for realizing various processes executed by the substrate processing system 100 under the control of the controller 31, and a recipe recorded with, for example, processing condition data. The user interface 32 and the storage part 33 are connected to the controller 31. As required, an arbitrary recipe may be called from the storage part 33 using a command provided from the user interface 32 and is executed in the controller 31, so that a desired process in the substrate processing system 100 is performed under the control of the controller 31.

Recipes such as a control program and processing condition data may be used in the state of being stored in a computer-readable recording media such as a CD-ROM, a hard disk, a flexible disk or a flash memory. In addition, the recipes may be transmitted from another device at any time via a dedicated line and may be used in an online environment.

[Operation of Substrate Processing System]

An example of the operation of the substrate processing system 100 will be described.

First, the two forks 17a and 17b of the transfer device 15 are moved forward and backward to receive substrates S from the cassette 11a that accommodates unprocessed substrates, and load the substrates on the buffer 28 of the substrate accommodation part 27 configured in the vertical two stages inside the load-lock chamber 5, respectively.

Subsequently, the forks 17a and 17b are withdrawn from the load-lock chamber 5, and the atmospheric-side gate valve 7c of the load-lock chamber 5 is closed. The load-lock chamber 5 is exhausted such that the interior of the load-lock chamber 5 is depressurized to a predetermined degree of vacuum. Subsequently, the gate valve 7b between the transfer chamber 3 and the load-lock chamber 5 is opened, and the fork 101 of the transfer device 23 receives the substrate S accommodated in the substrate accommodation parts 27 of the load-lock chamber 5.

Subsequently, the substrate S is loaded into any one of the process chambers 1a, 1b, and 1c by the fork 101 of the transfer device 23, and is delivered to the susceptor 2 of the respective chamber. Subsequently, a predetermined process is performed on the substrate S in the respective process chamber 1a, 1b, or 1c. The substrate S subjected to the predetermined process is delivered from the susceptor 2 to the fork 101 of the transfer device 23, and is unloaded from the respective process chamber 1a, 1b, or 1c. The substrate S unloaded from the process chamber 1a, 1b, or 1c is accommodated in the cassette 11b by the transfer device 15 via the load-lock chamber 5 in the path reverse to that used when loading the substrate S into the process chamber 1a, 1b, or 1c. In some embodiments, the substrate S subjected to the predetermined process may be returned to the original cassette

[Automatic Supervising Method]

An automatic supervising method for the transfer operation performed by the transfer device 23 will be described. The automatic supervising method includes: a step of radiating light toward an object below the supporting pick 119 from the light emitting parts 51a, 52a, 61a, and 62a and receiving a reflected light reflected off the object by the light receiving parts 51b, 52b, 61b, and 62b while horizontally moving the supporting pick 119, thus acquiring a change in intensity of the reflected light; and a step of specifying an end position of the object on the basis of the change in intensity of the reflected light. The automatic supervising method is executed by a control device 200 provided separately from the control part 30 of the substrate processing system 100, for example, during start-up or after maintenance of the substrate processing system 100. In some embodiments, the automatic supervising method may be performed by the control part 30 of the substrate processing system 100.

Figure 6:
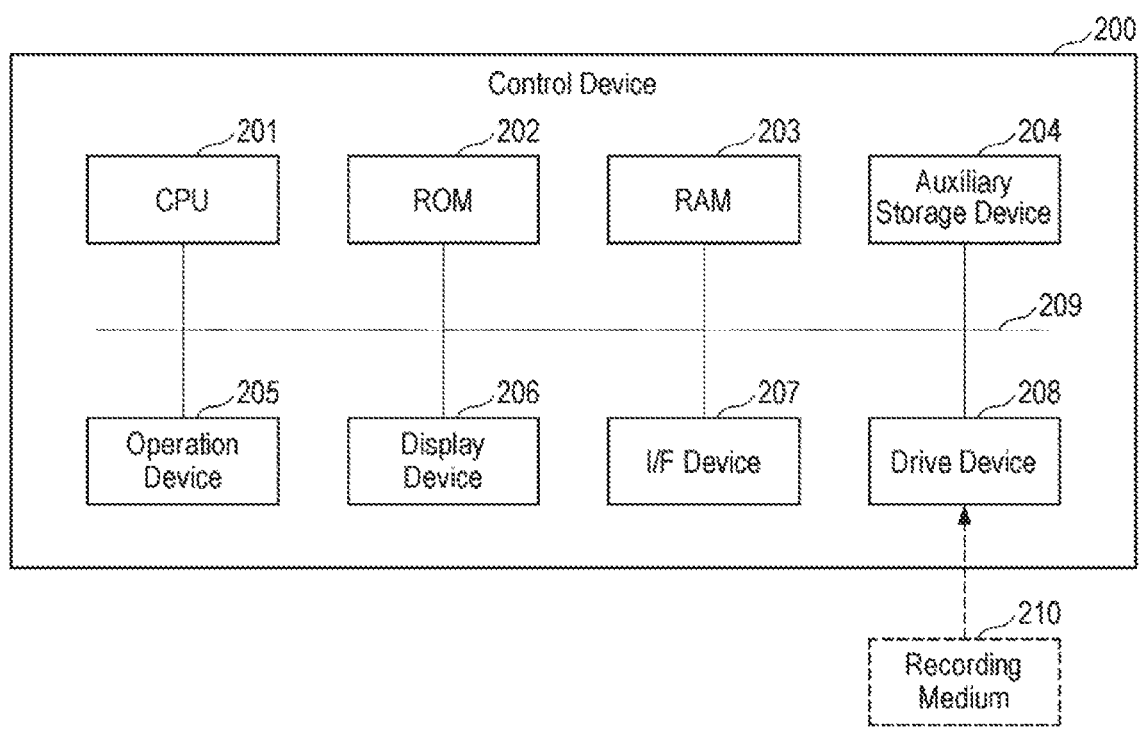
FIG. 6 is a view illustrating an exemplary hardware configuration of a control device.

First, a hardware configuration of the control device 200 will be described. FIG. 6 is a view illustrating an exemplary hardware configuration of the control device 200.

The control device 200 includes a CPU 201, a ROM 202, and a RAM 203. The CPU 201, the ROM 202, and the RAM 203 form a so-called computer. Further, the control device 200 includes an auxiliary storage device 204, an operation device 205, a display device 206, an interface (I/F) device 207, and a drive device 208. In addition, respective hardware components of the control device 200 are coupled to each other via a bus 209.

The CPU 201 executes various programs installed in the auxiliary storage device 204.

The ROM 202 is a nonvolatile memory, and functions as a main storage device. The ROM 202 stores, for example, various programs and data necessary for the CPU 201 to execute various programs installed in the auxiliary storage device 204.

The RAM 203 is a volatile memory such as a DRAM or an SRAM, and functions as a main storage device. The RAM 203 provides a work area to be deployed when various programs installed in the auxiliary storage device 204 are executed by the CPU 201.

The auxiliary storage device 204 stores various programs and backup files acquired by executing the various programs by the CPU 201.

The operation device 205 is an input device used by an operator of the control device 200 to input various instructions to the control device 200. The display device 206 displays internal information of the control device 200 thereon.

The I/F device 207 is a connection device connected to a network so as to communicate with the control part 30 of the substrate processing system 100.

The drive device 208 is a device for reading a recording medium 210. The recording medium 210 includes a medium for optically, electrically or magnetically recording information, such as a CD-ROM, a flexible disk, or a magneto-optical disk. In addition, the recording medium 210 may include a semiconductor memory that electrically records information, such as, a ROM or a flash memory.

In addition, various programs may be installed in the auxiliary storage device 204 by inserting the recording medium 210 available in the marketplace into the drive device 208 and reading out, by the drive device 208, the various programs recorded in the recording medium 210. In addition, the various programs may be installed in the auxiliary storage device 204 by being downloaded via a network.

Figure 7:
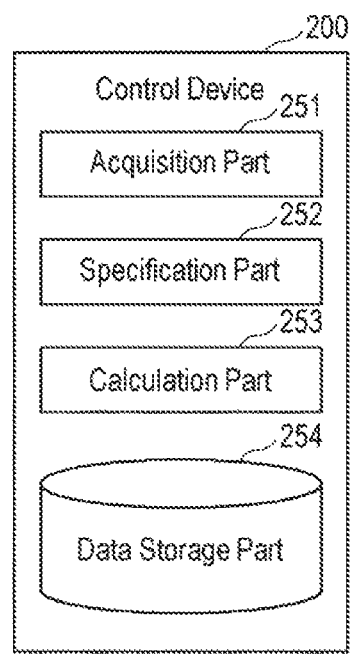
FIG. 7 is a view illustrating an exemplary functional configuration of the control device.

Next, an exemplary functional configuration of the control device 200 will be described. FIG. 7 is a view illustrating the exemplary functional configuration of the control device 200.

The control device 200 includes an acquisition part 251, a specification part 252, a calculation part 253, and a data storage part 254.

The acquisition part 251 acquires changes in intensity of the reflected light outputted from the optical sensors 51, 52, 53, 61, 62, and 63. For example, the acquisition part 251 acquires changes in intensity of the reflected light outputted from the optical sensors 51, 52, 61, and 62 when the supporting pick 119 is moved horizontally. Specifically, when light is radiated from the light emitting parts 51a, 52a, 61a, and 62a toward an object below the supporting pick 119 while the supporting pick 119 is being moved horizontally, the acquisition part 251 acquires changes in intensity of the reflected light reflected off the object, which are received by the light receiving parts 51b, 52b, 61b, and 62b In addition, the acquisition part 251 acquires changes in intensity of the reflected light outputted from the optical sensors 53 and 63 when the supporting pick 119 is vertically moved. Specifically, when light is radiated from the light emitting parts 53a and 63a toward an object in the direction of the head of the supporting pick 119 while the supporting pick 119 is being moved in the vertical direction, the acquisition part 251 acquires changes in intensity of reflected lights reflected off the object, which are received by the light receiving parts 53b and 63b In addition, the acquisition part 251 may acquire changes in intensity of reflected lights outputted from the optical sensors 53 and 63 when the supporting pick 119 is rotated in the horizontal direction. Specifically, when light is radiated from the light emitting parts 53a and 63a toward the object in the direction of the head of the supporting pick 119 while the supporting pick 119 is being rotated in the horizontal direction, the acquisition part 251 acquires changes in intensity of reflected lights reflected off the object, which are received by the light receiving parts 53b and 63b The specification part 252 specifies the end position of the object on the basis of the changes in intensity of the reflected lights acquired by the acquisition part 251. For example, the specification part 252 may specify, as the end position of the object, a position where the change amount in intensity of the reflected light from the supporting pick 119 becomes zero after it is increased, a position where the change amount in the intensity of reflected light is varied from the decrease to the increase, or a position where the change amount in intensity of the reflected light is varied from the increase to the decrease. The expression "the change amount in intensity of the reflected light becomes zero" used herein means that the intensity of reflected light is at a constant value (encompassing the case where it is at zero). In addition, the change in intensity of the reflected light is not limited to thereto.

The calculation part 253 calculates a correction value for correcting the operation of the transfer device 23 or the positioner 29 on the basis of the end position of the object specified by the specification part 252. For example, the calculation part 253 may calculate, as a correction value, a difference between the end position of the object specified by the specification part 252 and a position previously set as the end position of the object.

The data storage part 254 stores various data. The various data may include the changes in intensity of the reflected lights acquired by the acquisition part 251, the end position of the object specified by the specification part 252, the correction value for correcting the operation of the transfer device 23 or the positioner 29 calculated by the calculation part 253, and the position previously set as the end position of the object.

The configuration of the control device that implements the automatic supervising method is not limited to the above. For example, singularity in the change in intensity of the reflected light may be detected by transmitting the changes in intensity of the reflected lights acquired by the acquisition part 251 to a sequencer as digital data through a circuit dedicated to a laser sensor, transmitting the digital data from the sequencer to an apparatus controller, and then analyzing the transmitted digital data by the apparatus controller. The singularity may include, in addition to a positive peak and a negative peak in the intensity change an increase and a decrease in light emission intensity leading to these peaks.

Next, automatic supervising methods according to first to third embodiments, which are capable of automatically performing a position adjustment in the transfer operation, will be described.

First Embodiment

An example of the automatic supervising method for the operation of the transfer device 23 in the load-lock chamber 5 will be described as a first embodiment. FIG. 8 is a flowchart illustrating the automatic supervising method according to the first embodiment.

As illustrated in FIG. 8, the method of automatically supervising the operation of the transfer device 23 in the load-lock chamber 5 includes steps S11 to S15. Step S11 performs a temporary correction of the transfer device 23 in a vertical direction. Step S12 performs a temporary correction of the transfer device 23 in a rotational direction. Step S13 performs a main correction of the transfer device 23 in the vertical direction. Step S14 performs a main correction of the transfer device 23 in a front-rear direction. Step S15 performs a main correction of the transfer device 23 in the rotational direction. Hereinafter, steps S11 to S15 will be described below with reference to FIGS. 9A to 13B, respectively.

Figure 9A:
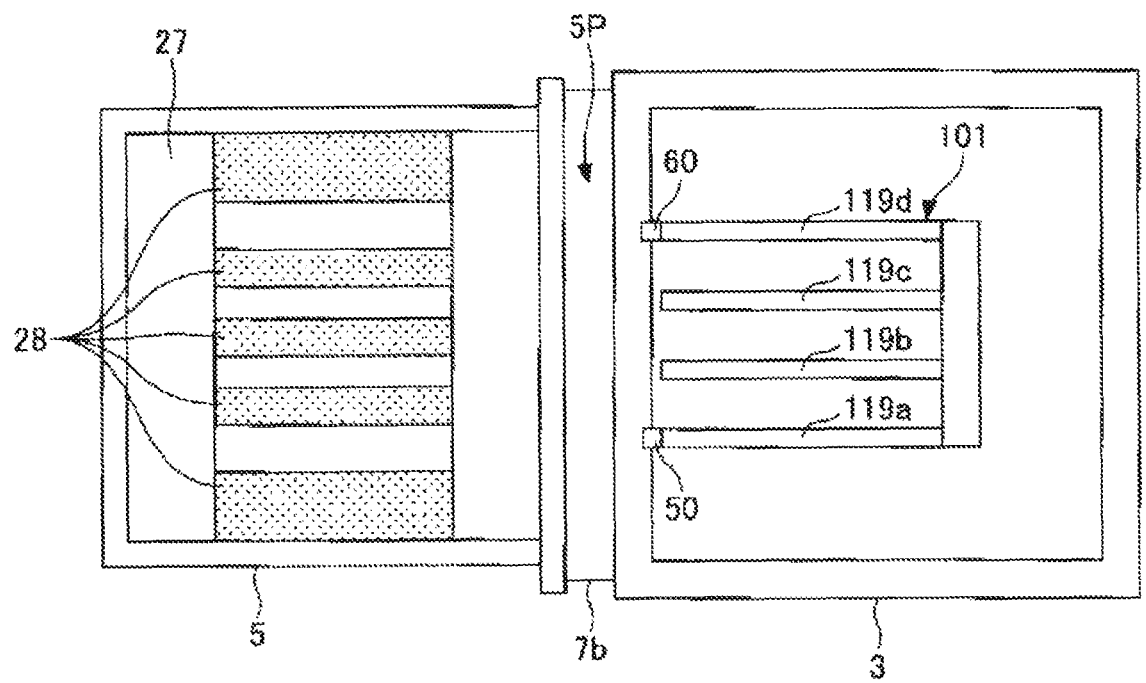
FIGS. 9A and 9B are views for explaining step S11 in the automatic supervising method according to the first embodiment.
Figure 9B:
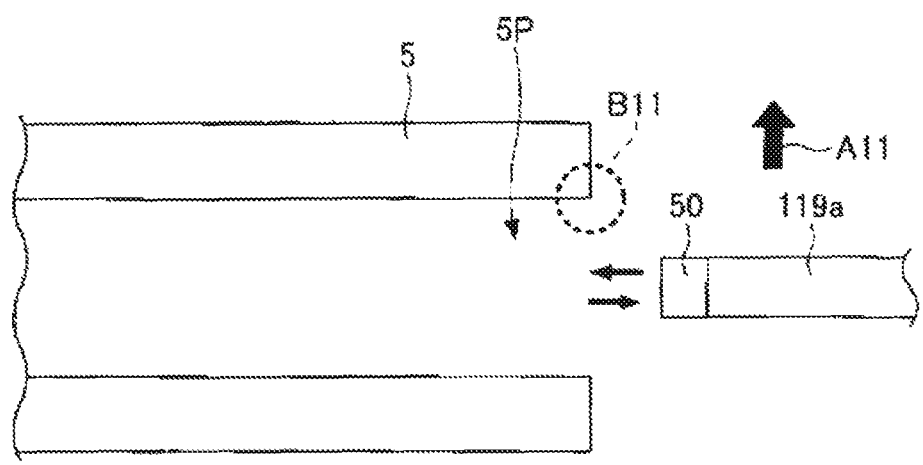

FIGS. 9A and 9B are views for explaining step S11 in the automatic supervising method according to the first embodiment. FIG. 9A is a plan view and FIG. 9B is a side view.

In step S11, as illustrated in FIG. 9A, the fork 101 is moved such that the head of the supporting pick 119 is located at the side of the transfer chamber 3 between the transfer chamber 3 and the load-lock chamber 5 by a predetermined distance (e.g., 70 mm) from an opening 5P. Subsequently, as illustrated in FIG. 9B, while the supporting pick 119 is being moved upward (see arrow A11), light is radiated from the light emitting parts 53a and 63a toward the head of the supporting pick 119, and reflected lights reflected off the head is received by the light receiving parts 53b and 63b. Then, the acquisition part 251 acquires changes in intensity of the reflected lights. At this time, at an upper end position B11 of the opening 5P, the change amount in intensity of each reflected light is varied from zero to an increase, and then is varied from the increase to zero. Thus, the specification part 252 specifies a position where the change amount in intensity of the reflected light is varied from zero to the increase or a position where the change amount in intensity of the reflected light is varied from the increase to zero, as the upper end position of the opening 5P. Subsequently, the calculation part 253 calculates a correction value for correcting the operation of the transfer device 23 on the basis of the upper end position of the opening 5P specified by the specification part 252. Subsequently, the control part 30 corrects the operation of the transfer device 23 on the basis of the correction value calculated by the calculation part 253 of the control device 200. As described above, in step S11, the temporary correction of the transfer device 23 in the vertical direction is performed.

Figure 14:
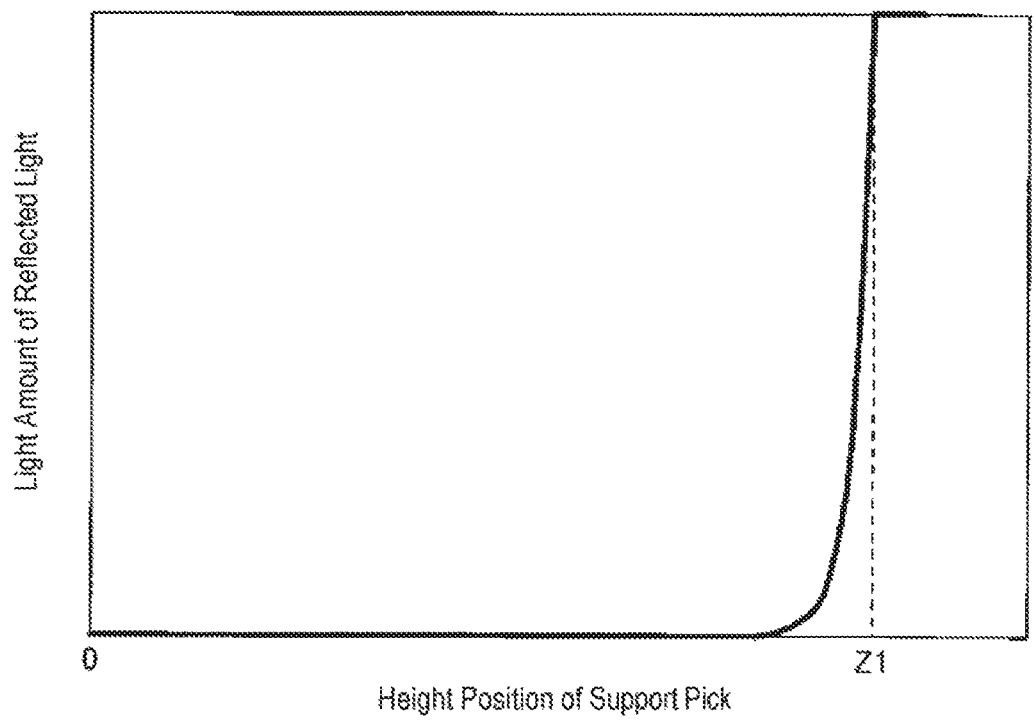
FIG. 14 is a diagram showing a relationship between a height position of the supporting pick and an amount of reflected light.

FIG. 14 is a diagram showing a relationship between a height position of the supporting pick 119 and an amount of reflected light. In FIG. 14, the vertical axis represents the amount of reflected light, and the horizontal axis represents the height position of the supporting pick 119. In the example of FIG. 14, when the height position is Z1, the change amount in intensity of the reflected light is varied from an increase to zero. Thereby, the specification part 252 specifies that the height position Z1 is the upper end position of the opening 5P.

Figure 10A:
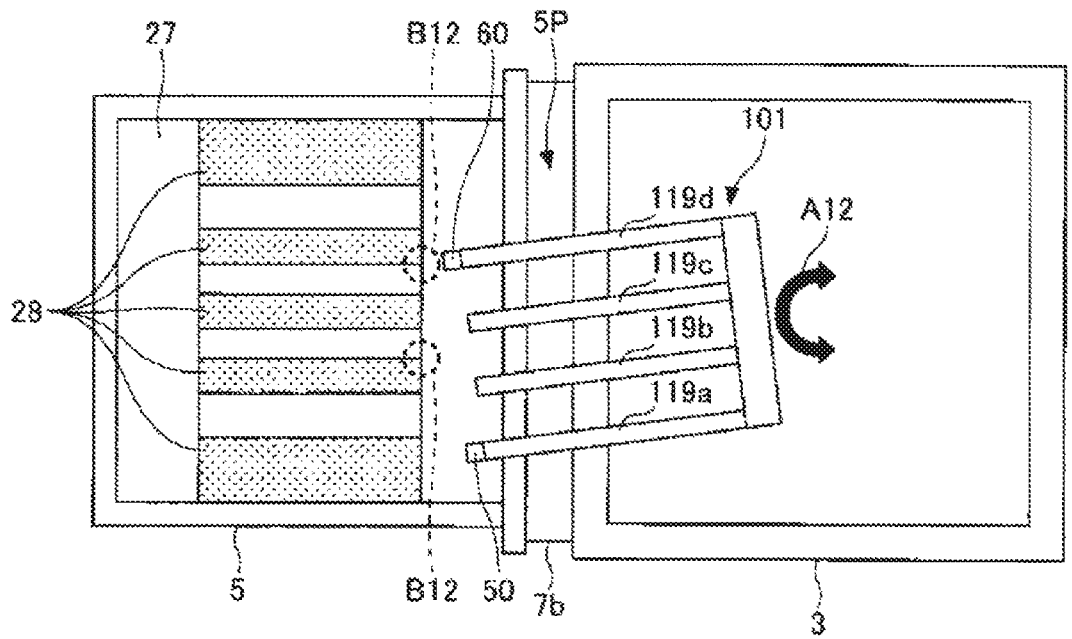
FIGS. 10A and 10B are views for explaining step S12 in the automatic supervising method according to the first embodiment.
Figure 10B:
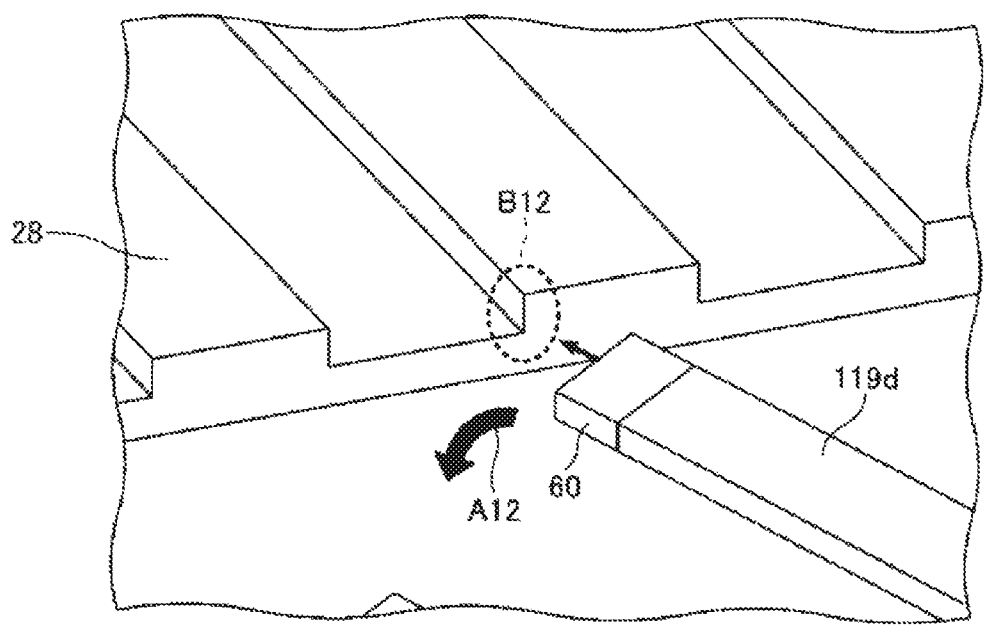

FIGS. 10A and 10B are views for explaining step S12 in the automatic supervising method according to the first embodiment. FIG. 10A is a plan view, and FIG. 10B is a perspective view.

In step S12, as illustrated in FIG. 10A, the fork 101 is moved toward the load-lock chamber 5 such that the head of the supporting pick 119 is positioned at the side of the transfer chamber 3 by a predetermined distance from an end portion near the transfer chamber 3 in the buffer 28. Subsequently, as illustrated in FIG. 10B, while the supporting pick 119 is being rotated (see arrow A12), light is radiated from the light emitting parts 53a and 63a in the direction of the head of the supporting pick 119, and reflected light is received by the light receiving parts 53b and 63b. Then, the acquisition part 251 acquires a change in intensity of the reflected light. At this time, the change amount in intensity of the reflected light is varied from zero to a decrease and then is varied from the decrease to zero at a sidewall position B12 of the buffer 28. Thus, the specification part 252 specifies a position where the change amount in intensity of the reflected light is varied from zero to the decrease or a position where the change amount in intensity of the reflected light is varied from the decrease to zero, as the sidewall position of the buffer 28. Subsequently, the calculation part 253 calculates a correction value for correcting the operation of the transfer device 23 on the basis of the sidewall position of the buffer 28 specified by the specification part 252. Subsequently, the control part 30 corrects the operation of the transfer device 23 on the basis of the correction value calculated by the calculation part 253 of the control device 200. In this way, in step S12, the temporary correction of the transfer device 23 in the rotational direction is performed.

Figure 11A:
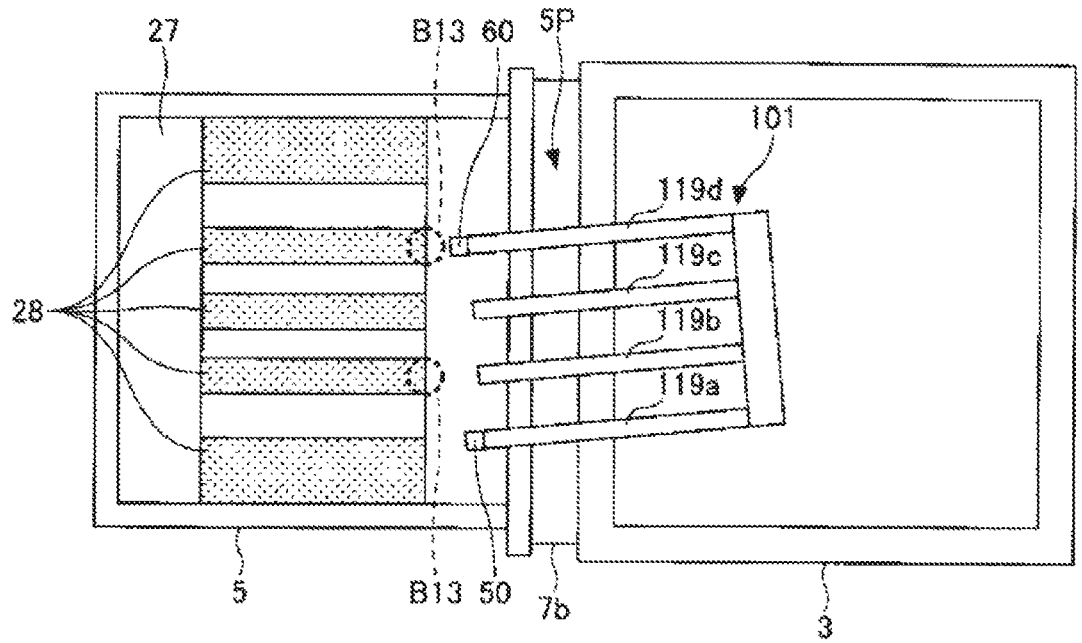
FIGS. 11A and 11B are views for explaining step S13 in the automatic supervising method according to the first embodiment.
Figure 11B:
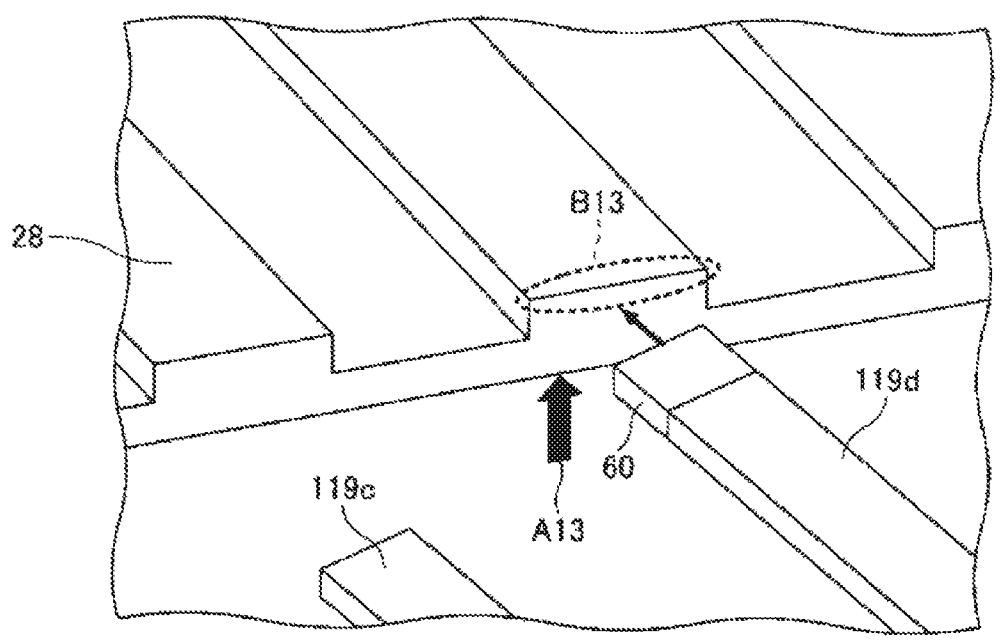

FIGS. 11A and 11B are views for explaining step S13 in the automatic supervising method according to the first embodiment. FIG. 11A is a plan view, and FIG. 11B is a perspective view.

In step S13, as illustrated in FIG. 11A, the fork 101 is moved such that the head of the supporting pick 119 is positioned at the side of the transfer chamber 3 by a predetermined distance from an end portion near the transfer chamber 3 in the buffer 28. Subsequently, as illustrated in FIG. 11B, while the supporting pick 119 is being moved upward (see arrow A13), light is radiated from the light emitting parts 53a and 63a in the direction of the head of the supporting pick 119, and reflected light reflected off the buffer 28 is received by the light receiving parts 53b and 63b. Then, the acquisition part 251 acquires a change in intensity of the reflected light. At this time, the change amount in intensity of the reflected light is varied from zero to a decrease and then is varied from the decrease to zero at an upper end position B13 of the buffer 28. Thus, the specification part 252 specifies a position where the change amount in intensity of the reflected light is varied from zero to the decrease or a position where the change amount in intensity of the reflected light is varied from the decrease to zero, as the upper end position of the buffer 28. Subsequently, the calculation part 253 calculates a correction value for correcting the operation of the transfer device 23 on the basis of the upper end position of the buffer 28 specified by the specification part 252. Subsequently, the control part 30 corrects the operation of the transfer device 23 on the basis of the correction value calculated by the calculation part 253 of the control device 200. In this way, in step S13, the main correction of the transfer device 23 in the vertical direction is performed.

Figure 12A:
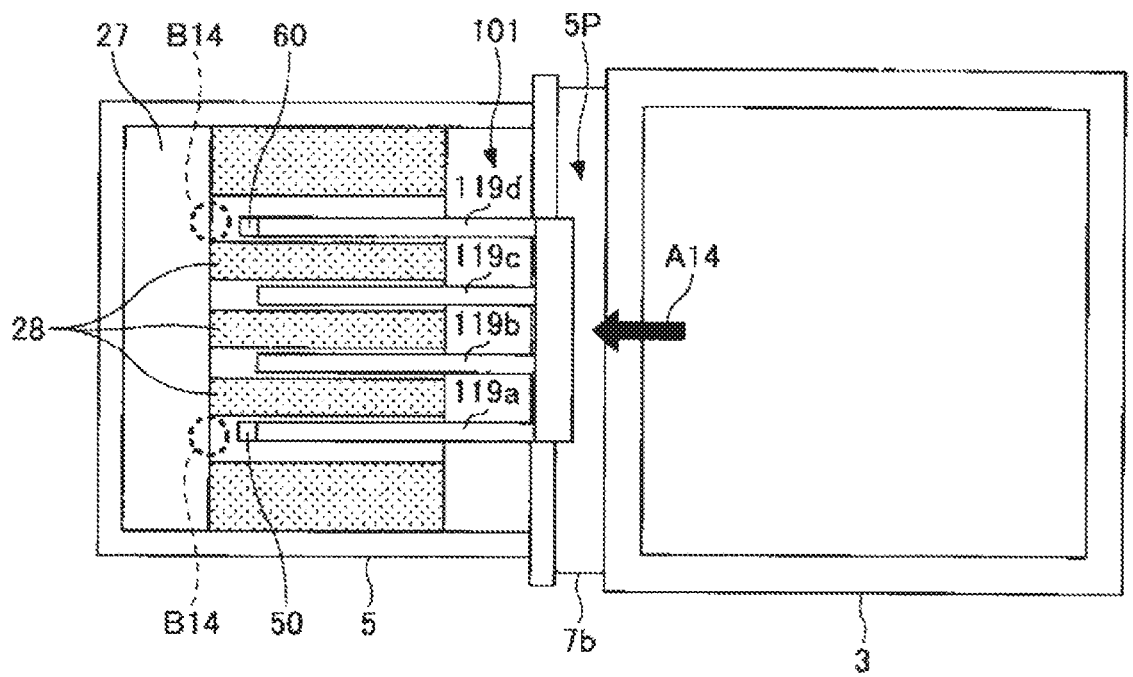
FIGS. 12A and 12B are views for explaining step S14 in the automatic supervising method according to the first embodiment.
Figure 12B:
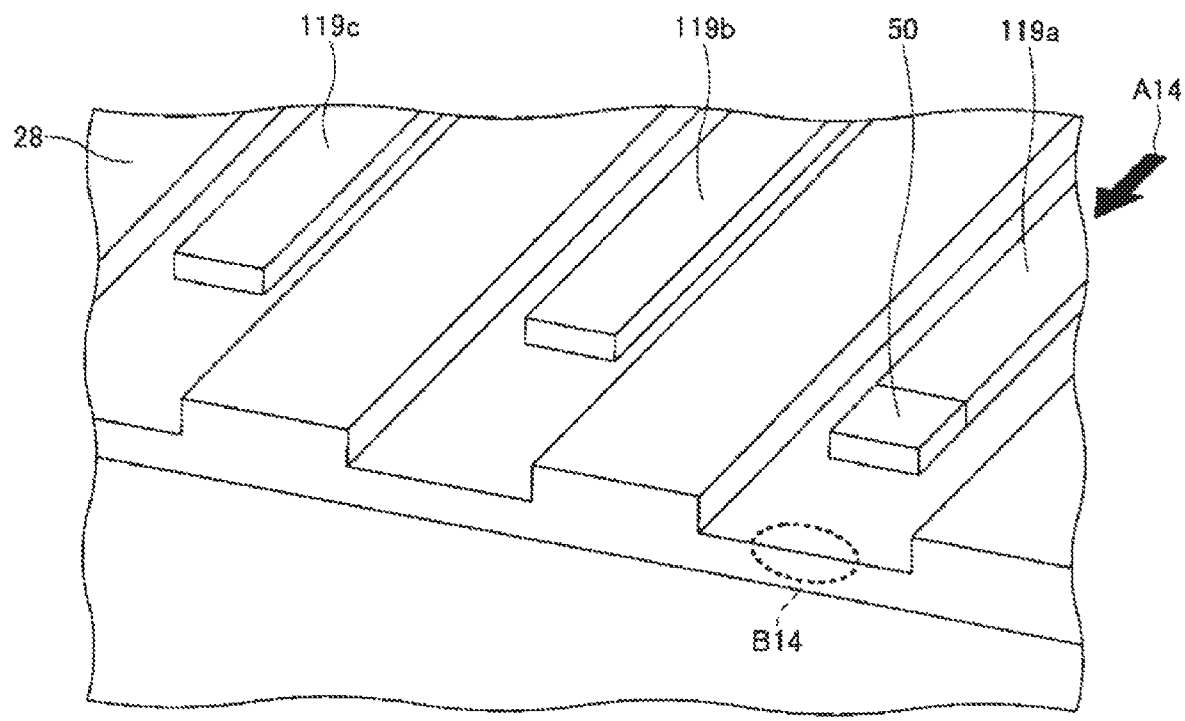

FIGS. 12A and 12B are views for explaining step S14 in the automatic supervising method according to the first embodiment. FIG. 12A is a plan view, and FIG. 12B is a perspective view.

In step S14, as illustrated in FIG. 12A, the fork 101 is moved such that the head of the supporting pick 119 is positioned at the side of the transfer chamber 3 by a predetermined distance from an end portion near the air atmosphere in the buffer 28. Subsequently, as illustrated in FIG. 12B, while the supporting pick 119 is being moved in the direction of the head (see arrow A14), light is radiated from the light emitting parts 51a and 61a downward of the supporting pick 119, and reflected light is received by the light receiving parts 51b and 61b. Then, the acquisition part 251 acquires a change in intensity of the reflected light. At this time, the change amount in intensity of the reflected light is varied from zero to a decrease and then is varied from the decrease to zero at a position B14 where the buffer 28 terminates. Thus, the specification part 252 specifies a position where the change amount in intensity of the reflected light is varied from zero to the decrease or a position where the change amount in intensity of the reflected light is varied from the decrease to zero, as the position where the buffer 28 terminates. Subsequently, the calculation part 253 calculates a correction value for correcting the operation of the transfer device 23 on the basis of the position where the buffer 28 terminates and is specified by the specification part 252. Subsequently, the control part 30 corrects the operation of the transfer device 23 on the basis of the correction value calculated by the calculation part 253 of the control device 200. In this way, in step S14, the main correction of the transfer device 23 in the front-rear direction is performed.

Figure 13A:
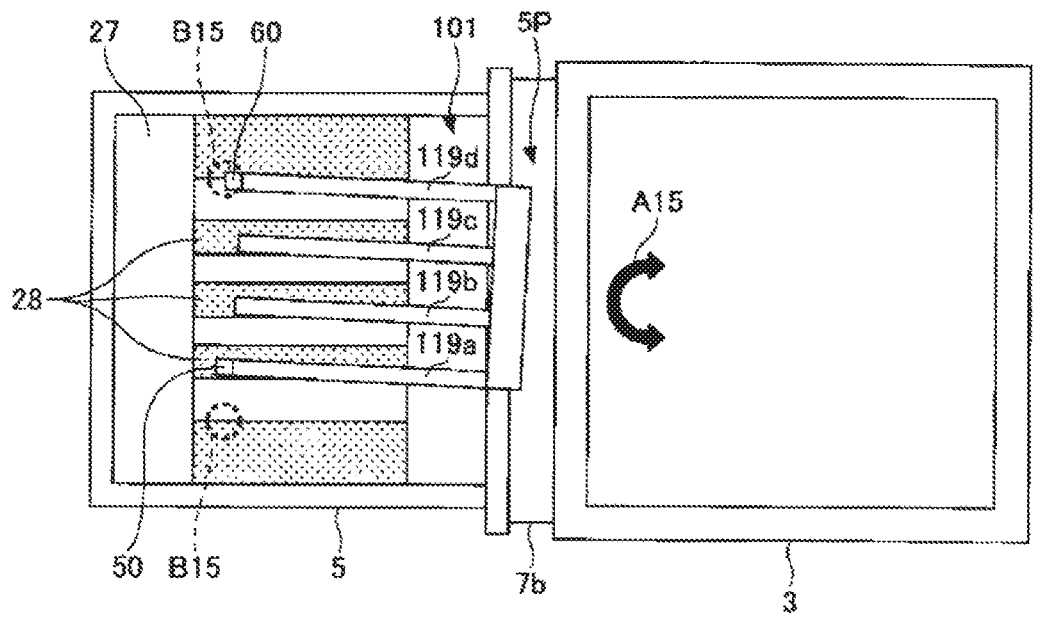
FIGS. 13A and 13B are views for explaining step S15 in the automatic supervising method according to the first embodiment.
Figure 13B:
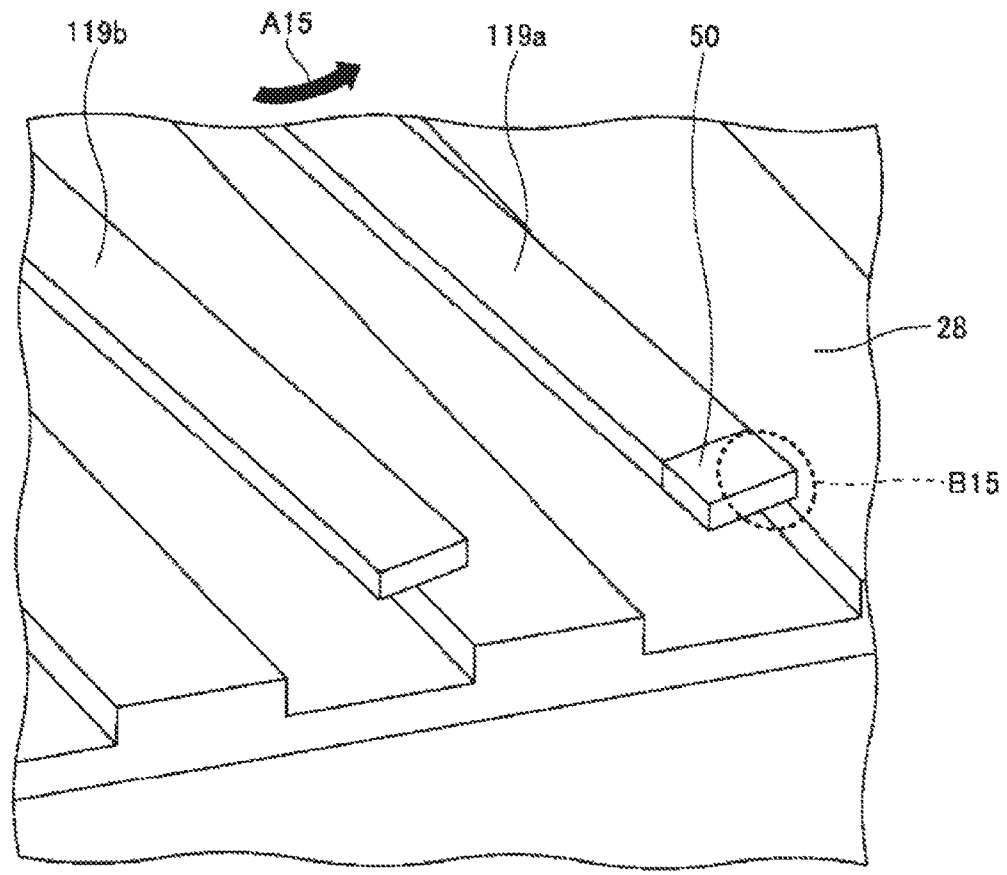

FIGS. 13A and 13B are views for explaining step S15 in the automatic supervising method according to the first embodiment. FIG. 13A is a plan view, and FIG. 13B is a perspective view.

In step S15, as illustrated in FIG. 13A, the fork 101 is moved such that the head of the supporting pick 119 is positioned at the side of the transfer chamber 3 by a predetermined distance from the end portion near the air atmosphere side in the buffer 28. Subsequently, as illustrated in FIG. 13B, while the supporting pick 119 is being rotated (see arrow A15), light is radiated from the light emitting parts 52a and 62a downward of the supporting pick 119, and reflected light is received by the light receiving parts 52b and 62b. Then, the acquisition part 251 acquires a change in intensity of the reflected light. At this time, the change amount in intensity of the reflected light is varied from zero to an increase and then is varied from the increase to zero at a sidewall position B15 near the air atmosphere in the buffer 28. Thus, the specification part 252 specifies a position where the change amount in intensity of the reflected light is varied from zero to the increase or a position where the change amount in intensity of the reflected light is varied from the increase to zero, as the sidewall position near the air atmosphere in the buffer 28. Subsequently, the calculation part 253 calculates a correction value for correcting the operation of the transfer device 23 on the basis of the sidewall position near the air atmosphere in the buffer 28 and specified by the specification part 252. Subsequently, the control part 30 corrects the operation of the transfer device 23 on the basis of the correction value calculated by the calculation part 253 of the control device 200. In this way, in step S15, the main correction of the transfer device 23 in the rotational direction is performed.

In the automatic supervising method according to the first embodiment described above, the end position of each portion in the load-lock chamber 5 is specified on the basis of the detection value of each optical sensor, the optical sensor including the light-emitting part and the light receiving part provided in the head of the supporting pick 119 for holding the substrate S. Further, the operation of the transfer device 23 is corrected on the basis of the correction value calculated using the end position. This makes it possible to automatically adjust an operation position of the transfer device 3 in the load-lock chamber 5. Therefore, it is possible to reduce the number of operation steps and to reduce a variation in supervising result, as compared with a case where an operator visually checks and manually adjusts a positional relationship with an object using a teaching (supervising) pendant or the like.

In the first embodiment, the case where all steps S11 to S15 are performed has been described. However, the present disclosure is not limited thereto. In some embodiments, only some of steps S11 to S15 may be performed.

Second Embodiment

Figure 15:
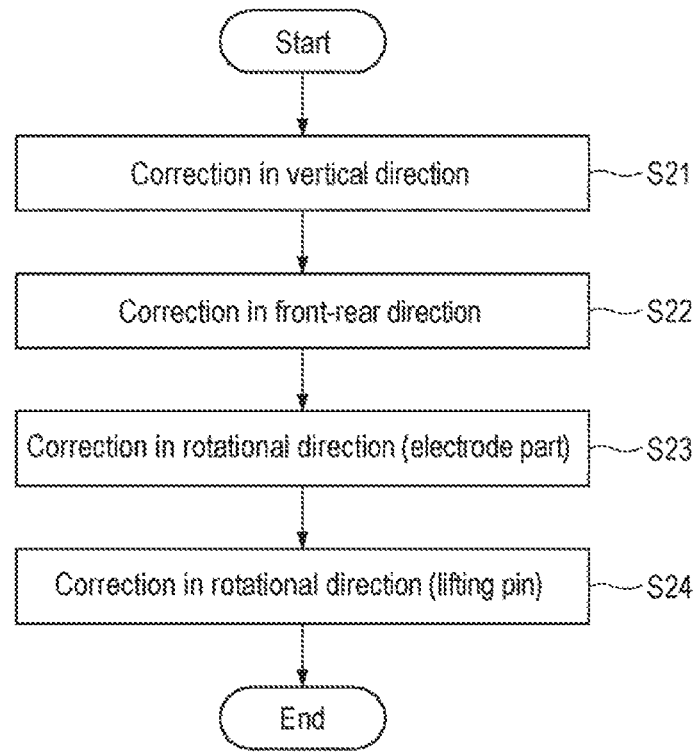
FIG. 15 is a flowchart illustrating an automatic supervising method according to a second embodiment.

In a second embodiment, an example of an automatic supervising method for the operation of the transfer device 23 in the process chamber 1a will be described. This holds true in automatic supervising methods for the operation of the transfer device 23 in the process chambers 1b and 1c. FIG. 15 is a flowchart illustrating the automatic supervising method according to the second embodiment.

As illustrated in FIG. 15, the method of automatically supervising the operation of the transfer device 23 in the process chamber 1a includes steps S21 to S24. Step S21 performs a correction of the transfer device 23 in the vertical direction. Step S22 performs a correction of the transfer device 23 in the front-rear direction. Step S23 performs a correction of the transfer device 23 in the rotational direction using an electrode part. Step S24 performs a correction of the transfer device 23 in the rotational direction using a lifting pin. Hereinafter, steps S21 to S24 will be described below with reference to FIGS. 16A to 19B, respectively.

Figure 16A:
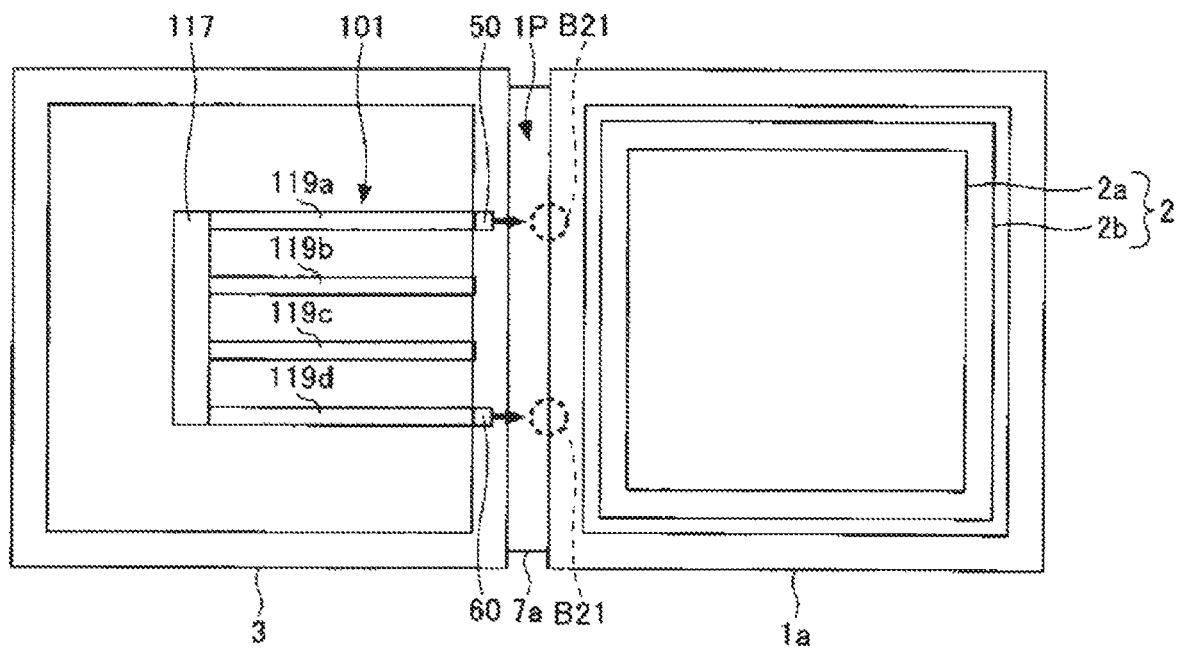
FIGS. 16A and 16B are views for explaining step S21 in the automatic supervising method according to the second embodiment.
Figure 16B:
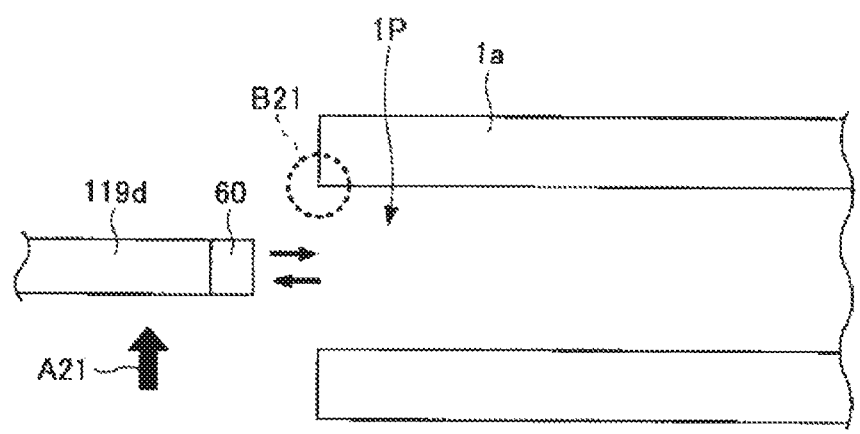

FIGS. 16A and 16B are views for explaining step S21 in the automatic supervising method according to the second embodiment. FIG. 16A is a plan view and FIG. 16B is a side view.

In step S21, as illustrated in FIG. 16A, the fork 101 is moved such that the head of the supporting pick 119 is located at the side of the transfer chamber 3 by a predetermined distance (e.g., 70 mm) from an opening 1P between the transfer chamber 3 and the process chamber 1a. Subsequently, as illustrated in FIG. 16B, while the supporting pick 119 is being moved upward (see arrow A21), light is radiated from the light emitting parts 53a and 63a in the direction of the head of the supporting pick 119, and reflected light is received by the light receiving parts 53b and 63b. Then, the acquisition part 251 acquires a change in intensity of the reflected light. At this time, the change amount in intensity of the reflected light is varied from zero to an increase and then is varied from the increase to zero at an upper end position B21 of the opening 1P. Thus, the specification part 252 specifies a position where the change amount in intensity of the reflected light is varied from zero to the increase or a position where the change amount in intensity of the reflected light is varied from the increase to zero, as the upper end position of the opening 1P. Subsequently, the calculation part 253 calculates a correction value for correcting the operation of the transfer device 23 on the basis of the upper end position of the opening 1P specified by the specification part 252. Subsequently, the control part 30 corrects the operation of the transfer device 23 on the basis of the correction value calculated by the calculation part 253 of the control device 200. In this way, in step S21, the correction of the transfer device 23 in the vertical direction is performed.

FIGS. 17A and 17B are views for explaining step S22 in the automatic supervising method according to the second embodiment. FIG. 17A is a plan view and FIG. 17B is a side view.

In step S22, as illustrated in FIG. 17A, the fork 101 is moved such that the head of the supporting pick 119 is positioned at a side close to the transfer chamber 3 by a predetermined distance from a termination position of the electrode part 2a of the susceptor 2 provided within the process chamber 1a. Subsequently, as illustrated in FIG. 17B, while the supporting pick 119 is being moved toward the base side (see arrow A22), light is radiated from the light emitting parts 51a and 61a downward of the supporting pick 119, and reflected light is received by the light receiving parts 51b and 61b. Then, the acquisition part 251 acquires a change in intensity of the reflected light. At this time, the change amount in intensity of the reflected light is varied from zero to a decrease, then is varied from the decrease to an increase, and then is varied from the increase to zero again, at a boundary position B22 between the electrode part 2a and the ceramic part 2b. Thus, the specification part 252 specifies a position where the change amount in intensity of the reflected light is varied from zero to the decrease, a position where the change amount in intensity of the reflected light is varied from the decrease to the increase, or a position where the change amount in intensity of the reflected light is varied from the increase to zero, as the boundary position between the electrode part 2a and the ceramic part 2b. Subsequently, the calculation part 253 calculates a correction value for correcting the operation of the transfer device 23 on the basis of the boundary position between the electrode part 2a and the ceramic part 2b specified by the specification part 252. Subsequently, the control part 30 corrects the operation of the transfer device 23 on the basis of the correction value calculated by the calculation part 253 of the control device 200. In this way, in step S22, the correction of the transfer device 23 in the front-rear direction is performed.

Figure 18:
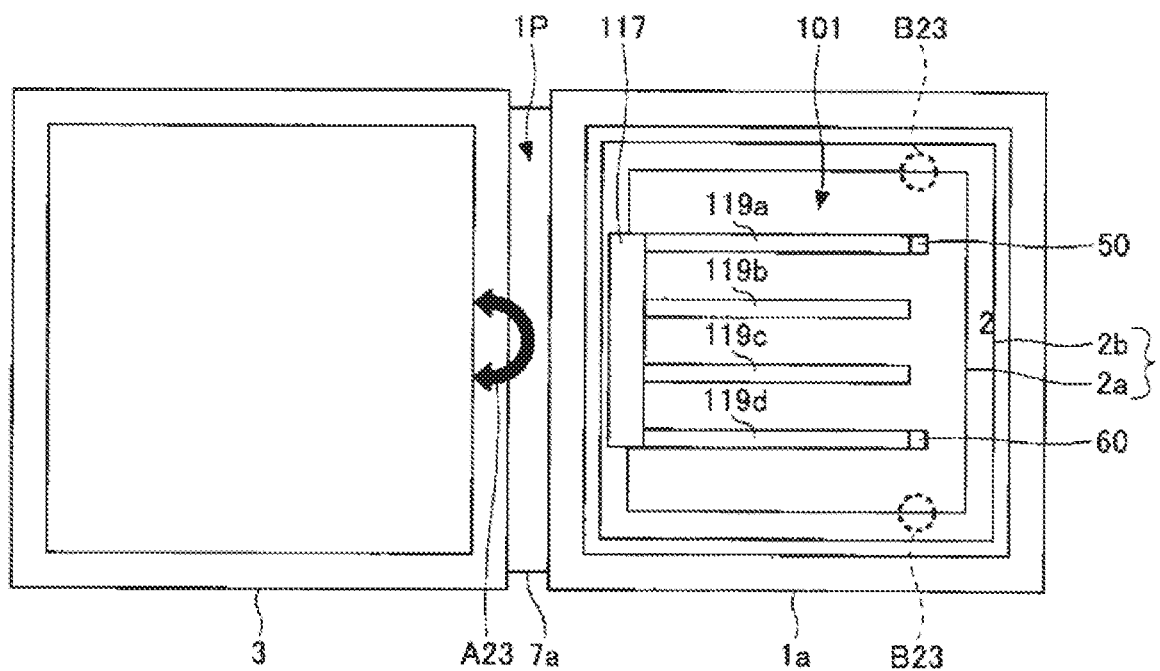
FIG. 18 is a view for explaining step S23 in the automatic supervising method according to the second embodiment.

FIG. 18 is a plan view for explaining step S23 in the automatic supervising method according to the second embodiment.

In step S23, as illustrated in FIG. 18, the fork 101 is moved such that the head of the supporting pick 119 is positioned near the center of the susceptor 2 by a predetermined distance from the left or right sidewall of the electrode part 2a of the susceptor 2 provided within the process chamber 1a. Subsequently, as illustrated in FIG. 18, while the supporting pick 119 is being rotated (see arrow A23), light is radiated from the light emitting parts 52a and 62a downward of the supporting pick 119, and reflected light is received by the light receiving parts 52b and 62b. Then, the acquisition part 251 acquires a change in intensity of the reflected light. At this time, the change amount in intensity of the reflected light is varied from zero to a decrease, then is varied from the decrease to an increase, and then is varied from the increase to zero again, at a boundary position B23 between the electrode part 2a and the ceramic part 2b. Thus, the specification part 252 specifies a position where the change amount in intensity of the reflected light is varied from zero to the decrease, a position where the change amount in intensity of the reflected light is varied from the decrease to the increase, or a position where the change amount in intensity of the reflected light is varied from the increase to zero, as the boundary position between the electrode part 2a and the ceramic part 2b. Subsequently, the calculation part 253 calculates a correction value for correcting the operation of the transfer device 23 on the basis of the boundary position between the electrode part 2a and the ceramic part 2b specified by the specification part 252. Subsequently, the control part 30 corrects the operation of the transfer device 23 on the basis of the correction value calculated by the calculation part 253 of the control device 200. In this way, in step S23, the correction of the transfer device 23 in the rotational direction is performed.

Figure 19A:
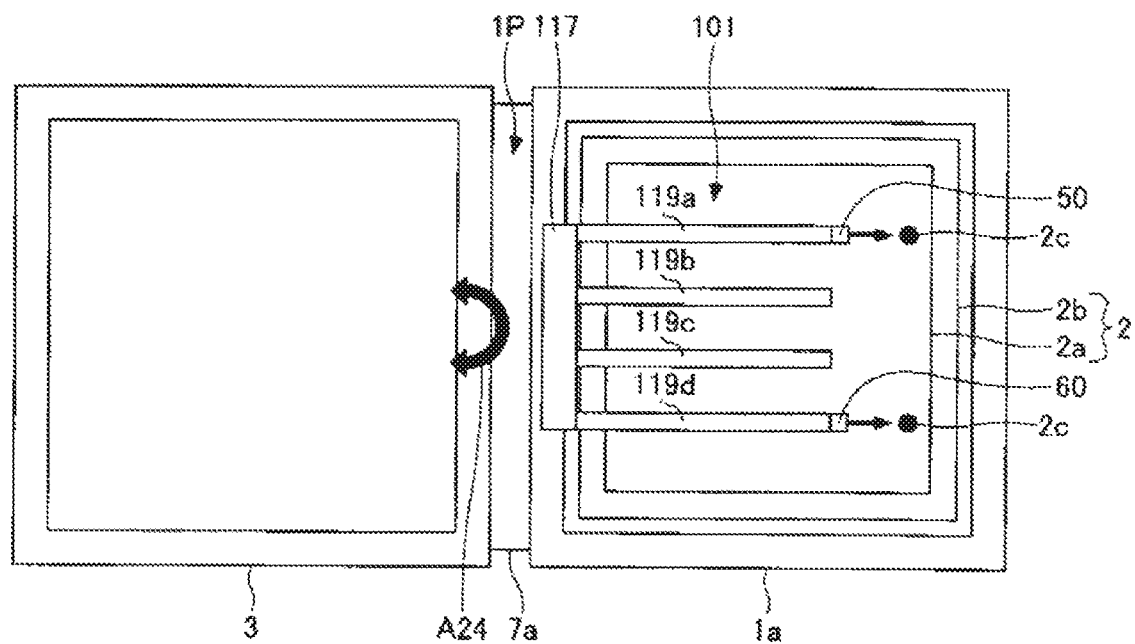
FIGS. 19A and 19B are views for explaining step S24 in the automatic supervising method according to the second embodiment.
Figure 19B:
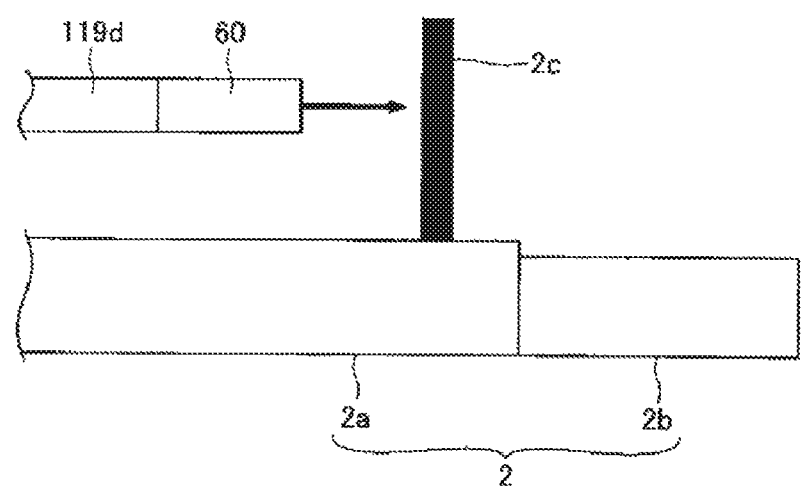

FIGS. 19A and 19B are views for explaining step S24 in the automatic supervising method according to the second embodiment. FIG. 19A is a plan view and FIG. 19B is a side view.

In step S24, as illustrated in FIG. 19A, the fork 101 is moved such that the head of the supporting pick 119 is positioned close to the transfer chamber 3 by a predetermined distance from a position of each lifting pin 2c provided within the process chamber 1a. Subsequently, as illustrated in FIG. 19B, the lifting pin 2c is made to protrude from an upper surface of the electrode part 2a. In addition, while the supporting pick 119 is being rotated (see arrow A24), light is radiated from the light emitting parts 53a and 63a in the direction of the head of the supporting pick 119, and reflected light is received by the light receiving parts 53b and 63b. Then, the acquisition part 251 acquires a change in intensity of the reflected light. At this time, the intensity of the reflected light manifests a peak value at the position of the lifting pin 2c. Therefore, the specification part 252 specifies that a position at which the intensity of the reflected light manifests the peak value is the position of the lifting pin 2c. Subsequently, the calculation part 253 calculates a correction value for correcting the operation of the transfer device 23 on the basis of the position of the lifting pin 2c specified by the specification part 252. Subsequently, the control part 30 corrects the operation of the transfer device 23 on the basis of the correction value calculated by the calculation part 253 of the control device 200. In this way, in step S24, the correction of the transfer device 23 in the rotational direction is performed.

Figure 20:
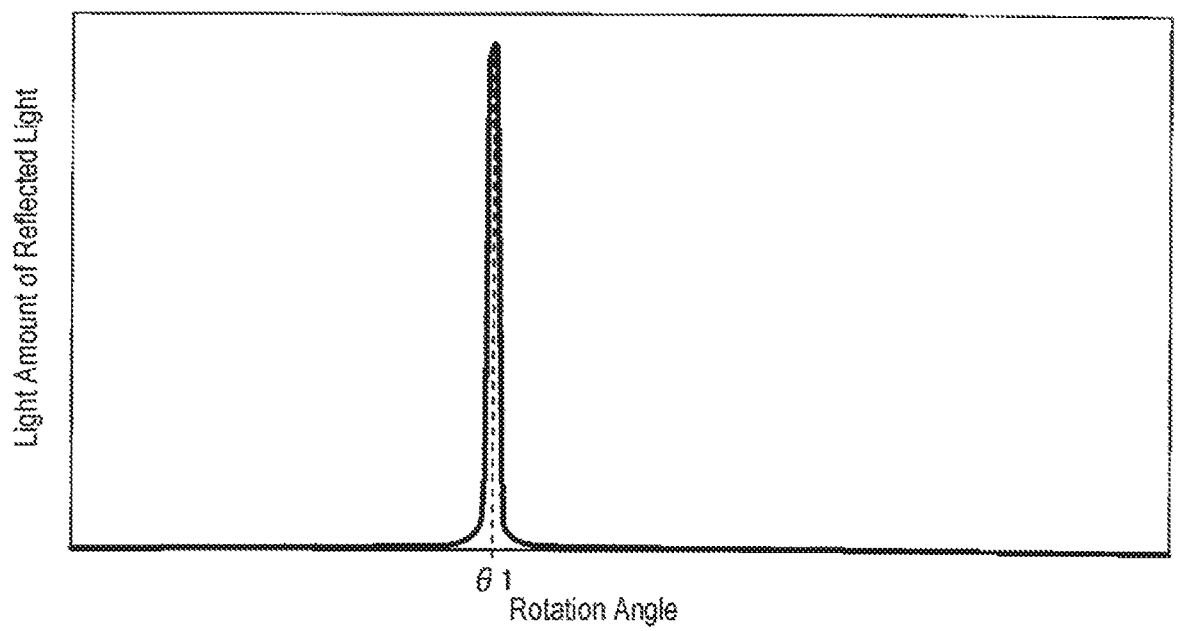
FIG. 20 is a diagram showing a relationship between a rotation angle of the supporting pick and an amount of reflected light.

FIG. 20 is a diagram showing a relationship between a rotation angle of the supporting pick 119 and an amount of reflected light. In FIG. 20, the vertical axis represents the amount of reflected light, and the horizontal axis represents the rotation angle of the supporting pick 119. In the example of FIG. 20, the intensity of the reflected light manifests the peak value when the rotation angle is $\theta 1$. Thus, the specification part 252 specifies that the rotation angle $\theta 1$ is the position of the lifting pin 2c.

In the automatic supervising method according to the second embodiment described above, the end position of each part or the position of the lifting pin in the process chamber 1a is specified on the basis of the detection value of each optical sensor, the optical sensor including the light-emitting part and the light receiving part provided in the head of the supporting pick 119 for holding the substrate S. Further, the operation of the transfer device 23 is corrected on the basis of the correction value calculated based on the end position or the position of the lifting pin. This makes it possible to automatically adjust an operation position of the transfer device 23 in the process chamber 1a. Therefore, it is possible to reduce the number of operation steps and to reduce a variation in supervising result, as compared with a case where an operator visually checks and manually adjusts a positional relationship with an object using a teaching (supervising) pendant or the like.

In the second embodiment, the case where all steps S21 to S24 are performed has been described. However, the present disclosure is not limited thereto. In some embodiments, only some of steps S21 to S24 may be performed.

Third Embodiment

Figure 21:
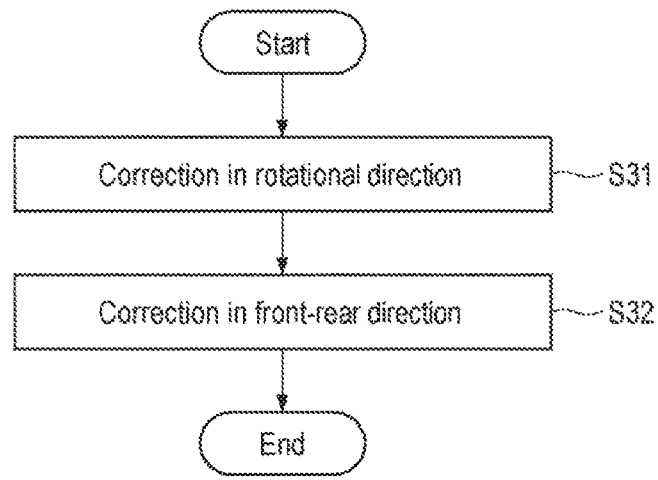
FIG. 21 is a flowchart illustrating an automatic supervising method according to a third embodiment.

In a third embodiment, an example of an automatic supervising method for the operation of the positioner 29 will be described. FIG. 21 is a flowchart illustrating the automatic supervising method according to the third embodiment.

As illustrated in FIG. 21, the method of automatically supervising the operation of the positioner 29 includes steps S31 and S32. Step S31 is a step of calculating a correction value with the movement of the transfer device 23 in the rotational direction to perform correction of the positioner 29. Step S32 is a step of calculating a correction value with the movement of the transfer device 23 in the front-rear direction to perform correction of the positioner 29. Hereinafter, steps S31 to S32 will be described below with reference to FIGS. 22 and 23B, respectively.

Figure 22:
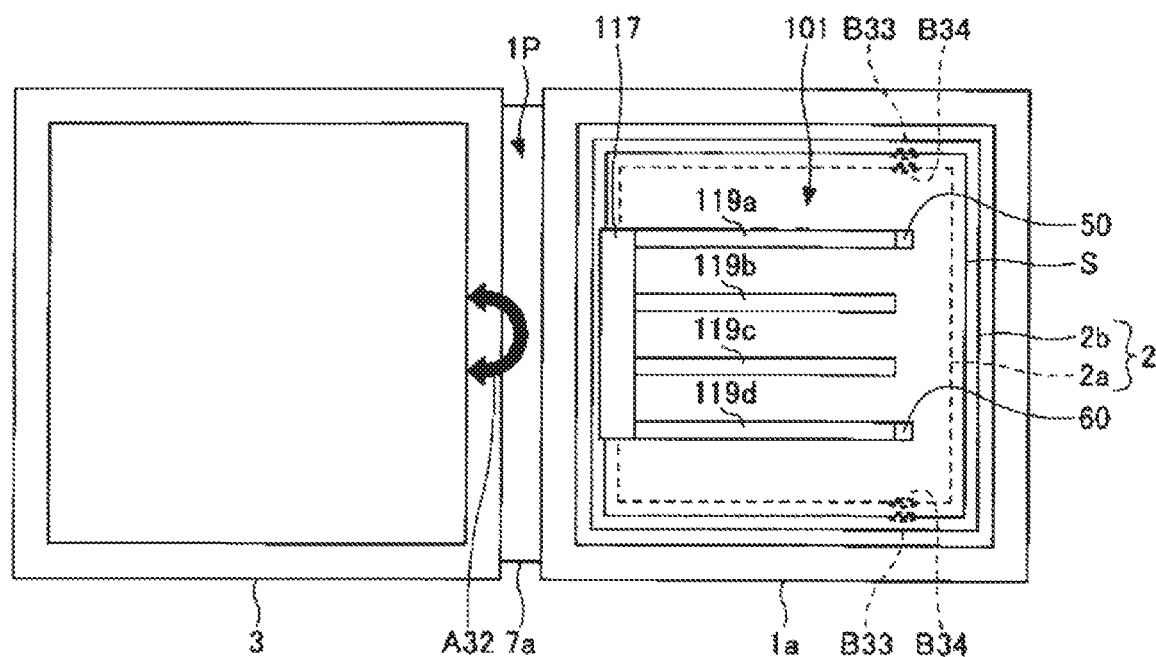
FIG. 22 is a view for explaining step S31 in the automatic supervising method according to the third embodiment.

FIG. 22 is a plan view for explaining step S31 in the automatic supervising method according to the third embodiment.

In step S31, as illustrated in FIG. 22, the fork 101 is moved such that the head of the supporting pick 119 is positioned close to the center of the susceptor 2 by a predetermined distance from the right or left sidewall of the electrode part 2a of the susceptor 2 provided within the process chamber 1a. Subsequently, while the supporting pick 119 is being rotated (see arrow A32), light is radiated from the light emitting parts 52a and 62a downward of the supporting pick 119, and reflected light is received by the light receiving parts 52b and 62b. Then, the acquisition part 251 acquires a change in intensity of the reflected light. At this time, the intensity of the reflected light is greatly varied at an end position B33 of the substrate S and at a boundary position B34 between the electrode part 2a and the ceramic part 2b. Therefore, the specification part 252 specifies that positions where the intensity of the reflected light is greatly varied are the end position of the substrate S and the boundary position between the electrode part 2a and the ceramic part 2b. Subsequently, the calculation part 253 calculates a protrusion amount of the electrode part 2a with respect to the substrate S on the basis of the end position of the substrate S and the boundary position between the electrode part 2a and the ceramic part 2b, specified by the specification part 252. In addition, the calculation part 253 calculates a correction amount for correcting the operation of the positioner 29 such that the calculated protrusion amount becomes a predetermined protrusion amount. Subsequently, the control part 30 corrects the operation of the positioner 29 on the basis of the correction value calculated by the calculation part 253 of the control device 200. In this way, in step S31, the correction of the positioner 29 in the rotational direction is performed.

Figure 23A:
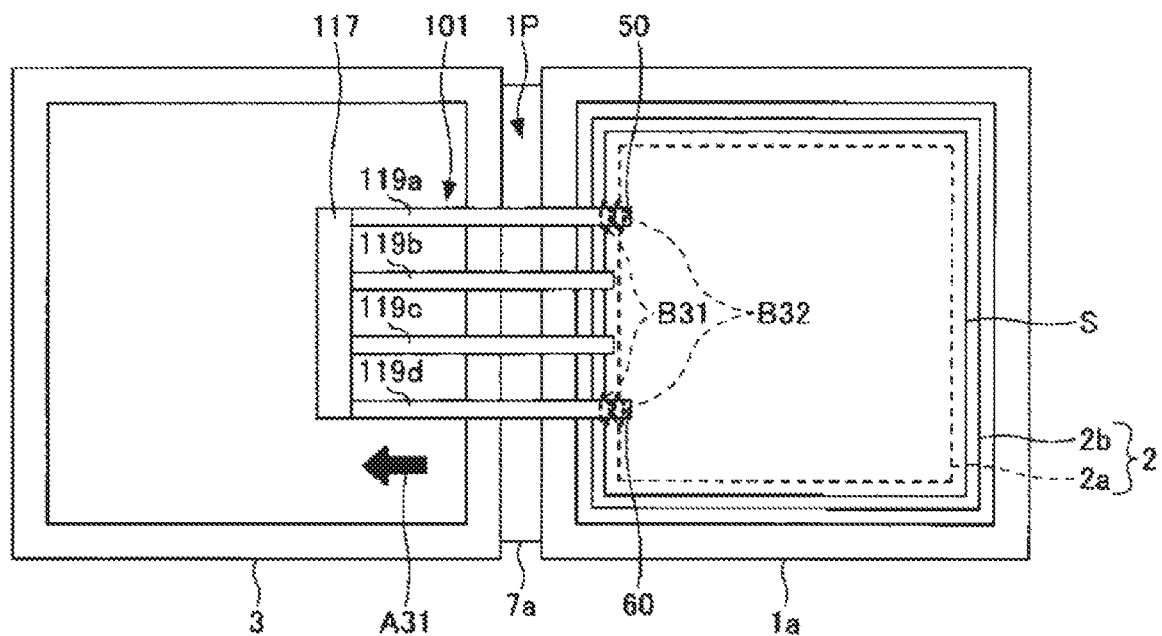
FIGS. 23A and 23B are views for explaining step S32 in the automatic supervising method according to the third embodiment.
Figure 23B:
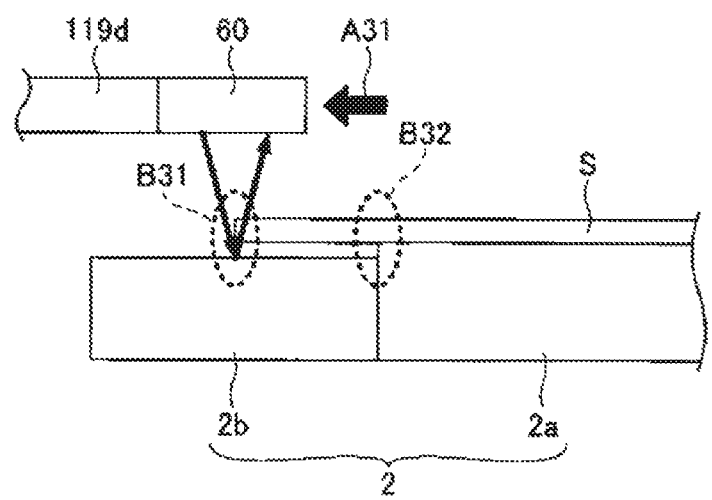

FIGS. 23A and 23B are views for explaining step S32 in the automatic supervising method according to the third embodiment. FIG. 23A is a plan view and FIG. 23B is a side view.

In step S32, as illustrated in FIG. 23A, the substrate S subjected to the positioning by the positioner 29 inside the load-lock chamber 5 is placed on the upper surface of the susceptor 2 provided inside the process chamber 1a. Subsequently, the fork 101 is moved such that the head of the supporting pick 119 is positioned close to the process chamber 1a by a predetermined distance from an end portion near the transfer chamber 3 in the substrate S. Subsequently, as illustrated in FIG. 23B, while the supporting pick 119 is being moved toward the base side (see arrow A31), light is radiated from the light emitting parts 51a and 61a downward of the supporting pick 119, and reflected light is received by the light receiving parts 51b and 61b. Then, the acquisition part 251 acquires a change in intensity of the reflected light. At this time, the intensity of the reflected light is greatly varied at an end position B31 of the substrate S and at a boundary position B32 between the electrode part 2a and the ceramic part 2b. Therefore, the specification part 252 specifies that positions where the intensity of the reflected light is greatly varied are the end position of the substrate S and the boundary position between the electrode part 2a and the ceramic part 2b. Subsequently, the calculation part 253 calculates a protrusion amount of the electrode part 2a with respect to the substrate S on the basis of the end position of the substrate S and the boundary position between the electrode part 2a and the ceramic part 2b, specified by the specification part 252. In addition, the calculation part 253 calculates a correction value for correcting the operation of the positioner 29 such that the calculated protrusion amount becomes a predetermined protrusion amount. Subsequently, the control part 30 corrects the operation of the positioner 29 on the basis of the correction value calculated by the calculation part 253 of the control device 200. In this way, in step S32, the correction of the positioner 29 in the front-rear direction is performed.

FIG. 24 is a diagram showing a relationship between a position of the supporting pick 119 in the slide direction of the fork 101 and an amount of reflected light. In FIG. 24, the vertical axis represents the amount of reflected light, and the horizontal axis represents the position of the supporting pick 119 in the slide direction of the fork 101. In the example of FIG. 24, when positions in the slide direction of the fork 101 are X1 and X2, the intensity of the reflected light is greatly varied. Thus, the specification part 252 specifies that the position X1 is the end position of the substrate S and the position X2 is the end position of the electrode part 2a. In addition, the relationship between the change in light amount and the position X1 and the position X2 is not limited to that shown in FIG. 24. In some embodiments, any positions where significant features are manifested in the change in light amount, namely a position Where a peak in change of the light amount is manifested, a position in which the light amount is rapidly varied and the like, may be associated with the position X1 and the position X2 of the fork 101.

In the automatic supervising method according to the third embodiment described above, the end position of each part in the process chamber 1a is specified on the basis of the detection value of each optical sensor, the optical sensor including the light-emitting part and the light receiving part provided in the head of the supporting pick 119 that holds the substrate S. Further, the operation of the positioner 29 is corrected on the basis of the correction value calculated based on the specified end position. This makes it possible to automatically adjust an operation position of the positioner 29. Therefore, it is possible to reduce the number of operation steps and to reduce a variation in supervising result, as compared with a case where an operator visually checks and manually adjusts a positional relationship with an object using a teaching (supervising) pendant or the like.

While in the third embodiment, in the state in which the substrate S is placed on the upper surface (placement surface) of the electrode part 2a of the susceptor 2, the case where the boundary position between the electrode part 2a and the ceramic part 2b is specified by the optical sensors has been described, the present disclosure is not limited thereto. For example, after the boundary position between the electrode part 2a and the ceramic part 2b is specified by the optical sensors in the state in which the substrate S is not placed on the upper surface of the electrode part 2a, the substrate S may be placed on the upper surface of the electrode part 2a, and subsequently, the end position of the substrate S may be specified by the optical sensors in the state in which the substrate S is placed on the upper surface of the electrode part 2a. In this case, the light radiated from the optical sensors is not blocked by the substrate 5, which makes it possible to specify the boundary position between the electrode part 2a and the ceramic part 2b with high accuracy. Therefore, when it is required to correct the operation of the positioner 29 with high accuracy, it is preferable to specify the boundary position between the electrode part 2a and the ceramic part 2b by the optical sensors in the state in which no substrate S is placed on the upper surface of the electrode part 2a of the susceptor 2. In addition, in the case in which the substrate S absorbs the light radiated from the optical sensors, it is preferable to specify the boundary position between the electrode part 2a and the ceramic part 2b by the optical sensors in the state in which the substrate S is not placed on the upper surface of the electrode part 2a of the susceptor 2.

In the third embodiment, the case where the substrate S positioned by the positioner 29 provided in the load-lock chamber 5 is placed on the susceptor 2 has been described, but the present disclosure is not limited thereto. For example, it is also possible to perform automatic supervising even in the case where a substrate S positioned by other parts is placed on the susceptor 2.

In the third embodiment, the case where step S31 and step S32 are performed has been described, but the present disclosure is not limited thereto. For example, even if only one of steps S31 and S32 may be performed.

According to the present disclosure, it is possible to automatically adjust the position of a transfer operation.

It should be noted that the embodiments disclosed herein are exemplary in all respects and are not restrictive. The above-described embodiments may be omitted, replaced or modified in various forms without departing from the scope and spirit of the appended claims.

Although the case where the substrate processing system includes three process chambers has been described in the above embodiments, the present disclosure is not limited thereto. For example, the substrate processing system may include a single process chamber, two process chambers, or four or more process chambers.

What is claimed is:

1. A method of automatically supervising a transfer operation of a transfer device including an optical sensor, the optical sensor having a light emitting part and a light receiving part provided in a head of a holding part for holding a substrate, the method comprising:
    acquiring a change in intensity of a first reflected light reflected off a first object by radiating a light from the light emitting part toward the first object below the holding part and receiving the first reflected light reflected off the first object by the light receiving part, while horizontally moving the holding part;
    specifying an end position of the first object based on the change in intensity of the first reflected light; and
    calculating a correction value for correcting the transfer operation of the transfer device based on the specified end position,
    wherein the transfer device is configured to be moved forward and backward with respect to a load-lock chamber provided with a buffer, the buffer comprising relief grooves through which the holding part passes and supporting portions disposed in a mutually spaced-apart relationship to support the substrate, and
    wherein the first object is the buffer.

2. The method of claim 1, wherein the horizontal movement is a rotation movement.

3. The method of claim 2, wherein the acquiring the change in intensity of the first reflected light comprises radiating a light by a first optical sensor having a first light emitting part corresponding to the light emitting part and a first light receiving part corresponding to the light receiving part, which are disposed along a widthwise direction of the holding part.

4. The method of claim 1, wherein the horizontal movement is a rectilinear movement.

5. The method of claim 4, wherein the acquiring the change in intensity of the first reflected light comprises radiating a light by a second optical sensor having a second light emitting part corresponding to the light emitting part and a second light receiving part corresponding to the light receiving part, which are disposed along a longitudinal direction of the holding part.

6. A method of automatically supervising a transfer operation of a transfer device including an optical sensor, the optical sensor having a light emitting part and a light receiving part provided in a head of a holding part for holding a substrate, the method comprising:
    acquiring a change in intensity of a first reflected light reflected off a first object by radiating a light from the light emitting part toward the first object below the holding part and receiving the first reflected light reflected off the first object by the light receiving part, while horizontally moving the holding part;
    specifying an end position of the first object based on the change in intensity of the first reflected light; and
    calculating a correction value for correcting an operation of a positioner based on the specified end position, the positioner being configured to perform a positioning of the substrate,
    wherein the transfer device is configured to be moved forward and backward with respect to a process chamber, the process chamber comprising a stage having a placement surface on which the substrate is placed,
    wherein the first object comprises the placement surface and the substrate placed on the placement surface,
    wherein the acquiring the change in intensity of the first reflected light further comprises: radiating the light in a state in which the substrate is not placed on the placement surface; and radiating the light in a state in which the substrate is placed on the placement surface,
    wherein the specifying the end position of the first object comprises: specifying a first end position of the placement surface based on the change in intensity of the first reflected light when the light is radiated in the state in which the substrate is not placed on the placement surface; and specifying a second end position of the substrate based on the change in intensity of the first reflected light when the light is radiated in the state in which the substrate is placed on the placement surface, and
    wherein the calculating the correction value for correcting the operation of the positioner includes calculating the correction value for correcting the operation of the positioner configured to perform the positioning of the substrate based on the first end position of the placement surface and the second end position of the substrate.

7. The method of claim 6, wherein an outer shape of the placement surface is smaller than an outer shape of the substrate, and
    wherein the calculating the correction value for correcting the operation of the positioner comprises calculating the correction value for correcting the operation of the positioner such that an amount of the substrate protruding beyond the placement surface is equal to a predetermined protrusion amount, the amount of the substrate protruding beyond the placement surface being calculated based on the first end position of the placement surface and the second end position of the substrate.

8. A method of automatically supervising a transfer operation of a transfer device including an optical sensor, the optical sensor having a light emitting part and a light receiving part provided in a head of a holding part for holding a substrate, the method comprising:
    acquiring a change in intensity of a first reflected light reflected off a first object by radiating a light from the light emitting part toward the first object below the holding part and receiving the first reflected light reflected off the first object by the light receiving part, while horizontally moving the holding part;
    specifying an end position of the first object based on the change in intensity of the first reflected light; and
    calculating a correction value for correcting an operation of a positioner based on the specified end position, the positioner being configured to perform a positioning of the substrate,
    wherein the transfer device is configured to be moved forward and backward with respect to a process chamber, the process chamber comprising a stage having a placement surface on which the substrate is placed, wherein the first object comprises the placement surface and the substrate placed on the placement surface, wherein the acquiring the change in intensity of the first reflected light further comprises radiating the light in a state in which the substrate is placed on the placement surface, wherein the specifying the end position of the first object comprises specifying a first end position of the placement surface and a second end position of the substrate based on the change in intensity of the first reflected light when the light is radiated in the state in which the substrate is placed on the placement surface, and wherein the calculating the correction value for correcting the operation of the positioner comprises calculating the correction value for correcting the operation of the positioner configured to perform the positioning of the substrate based on the first end position of the placement surface and the second end position of the substrate.

9. A method of automatically supervising a transfer operation of a transfer device including an optical sensor, the optical sensor having a light emitting part and a light receiving part provided in a head of a holding part for holding a substrate, the method comprising:

acquiring a change in intensity of a first reflected light reflected off a first object by radiating a light from the light emitting part toward the first object below the holding part and receiving the first reflected light reflected off the first object by the light receiving part, while horizontally moving the holding part;

specifying an end position of the first object based on the change in intensity of the first reflected light, acquiring a change in intensity of a second reflected light reflected off a second object by radiating a light from a third light emitting part toward the second object in a direction of the head of the holding part and receiving the second reflected light reflected off the second object by a third light receiving part, while moving the holding part; and specifying a position of the second object based on the change in intensity of the second reflected light, wherein the second object is a lifting pin configured to be raised or lowered with respect to a placement surface of a stage on which the substrate is placed.

10. A control device that automatically supervises a method of transferring a transfer device comprising an optical sensor, the optical sensor having a light emitting part and a light receiving part provided in a head of a holding part for holding a substrate, wherein the method comprises:

acquiring a change in intensity of a reflected light reflected off an object by radiating a light from the light emitting part toward the object below the holding part and receiving the reflected light reflected off the object by the light receiving part, while horizontally moving the holding part;

specifying an end position of the object based on the change in intensity of the reflected light; and calculating a correction value for correcting a transfer operation of the transfer device based on the specified end position, wherein the transfer device is configured to be moved forward and backward with respect to a load-lock chamber provided with a buffer, the buffer comprising relief grooves through which the holding part passes and supporting portions disposed in a mutually spaced-apart relationship to support the substrate, and wherein the first object is the buffer.

* * * * *